United States Patent [19]

Garverick et al.

[11] Patent Number: 5,298,805
[45] Date of Patent: Mar. 29, 1994

[54] VERSATILE AND EFFICIENT CELL-TO-LOCAL BUS INTERFACE IN A CONFIGURABLE LOGIC ARRAY

[75] Inventors: Tim Garverick, Cupertino; Jim Sutherland, Sunnyvale; Sanjay Popli, Sunnyvale; Venkata Alturi, Sunnyvale; Arthur Smith, Jr., San Carlos; Scott Pickett, Los Gatos; David Hawley, Belmont; Shao-Pin Chen, San Jose; Shankar Moni, Santa Clara; Benjamin S. Ting, Saratoga; Rafael C. Camarota, San Jose; Shin-Mann Day, Sunnyvale; Frederick Furtek, Menlo Park, all of Calif.

[73] Assignee: National Semiconductor Corporation, Santa Clara, Calif.

[21] Appl. No.: 44,921

[22] Filed: Apr. 8, 1993

Related U.S. Application Data

[63] Continuation of Ser. No. 752,282, Aug. 29, 1991, abandoned.

[51] Int. Cl.$^5$ .......................................... H03K 19/177
[52] U.S. Cl. .................................. 307/465; 307/475; 307/468
[58] Field of Search ............... 307/443, 465, 468–469, 307/465.1, 475

[56] References Cited

U.S. PATENT DOCUMENTS

| | | | |
|---|---|---|---|
| 4,642,487 | 2/1987 | Carter | 307/465.1 X |
| 4,670,749 | 6/1987 | Freeman | 307/465 X |
| 4,700,187 | 11/1987 | Furtek | 340/825 |
| 4,758,745 | 7/1988 | El Gamal et al. | 307/468 X |
| 4,870,302 | 9/1989 | Freeman | 307/465 |
| 4,873,459 | 11/1989 | El Gamal et al. | 307/465 |
| 4,876,466 | 10/1989 | Kondou et al. | 307/465 |
| 4,918,440 | 4/1990 | Furtek | 340/825 |
| 4,935,734 | 6/1990 | Austin | 340/825 |
| 5,003,200 | 3/1991 | Sakamoto | 307/465 |
| 5,019,736 | 5/1991 | Furtek | 307/465 |

FOREIGN PATENT DOCUMENTS

WO90/11648 10/1990 PCT Int'l Appl. ......... H03K 10/173

OTHER PUBLICATIONS

Sven Wahlstrom; Programable Logic Arrays–Cheaper by the Millions; Electronics, Dec. 11, 1967, pp. 90–95.
R. C. Minnick; Survey of Microcellular Research; Stanford Research Institute; Scientific Report 1; Jul. 1966; SRI Project 5876.
Robert C. Minnick; A Survey of Microcellular Research; Journal of the Associaiton for Computing Machinery, vol. 14, No. 2, Apr. 1967, pp. 203–241.
Richard G. Shoup; Programmable Cellular Logic Arrays; Computer Science Department Carnegie-Mellon Univ.; Mar. 1970.
Ivan Sutherland et al.; Large-Scale Integration Makes Logic Elements Fast and Cheap, . . . ; Microelectronics and Computer Science; Scientific American; Sep. 1977; vol. 237, No. 3; pp. 217–228.
Concurrent Logic, Inc. Data Sheet CFA6006 Field Programmable Gate Array; Advanced Info; Mar. 15, 1991, Rev. 2.2.

Primary Examiner—David R. Hudspeth
Attorney, Agent, or Firm—Limbach & Limbach

[57] ABSTRACT

A low transistor count programmable bussing resource for a programmable logic array allows the use of the bussing resources as inputs or outputs to a cell in the array and allows connections between different buses without effecting the normal use of the cell. The bussing resource allows efficient routing of signals between cells and is symmetric to allow rotation of logic macros built using combinations of cells and buses.

17 Claims, 30 Drawing Sheets

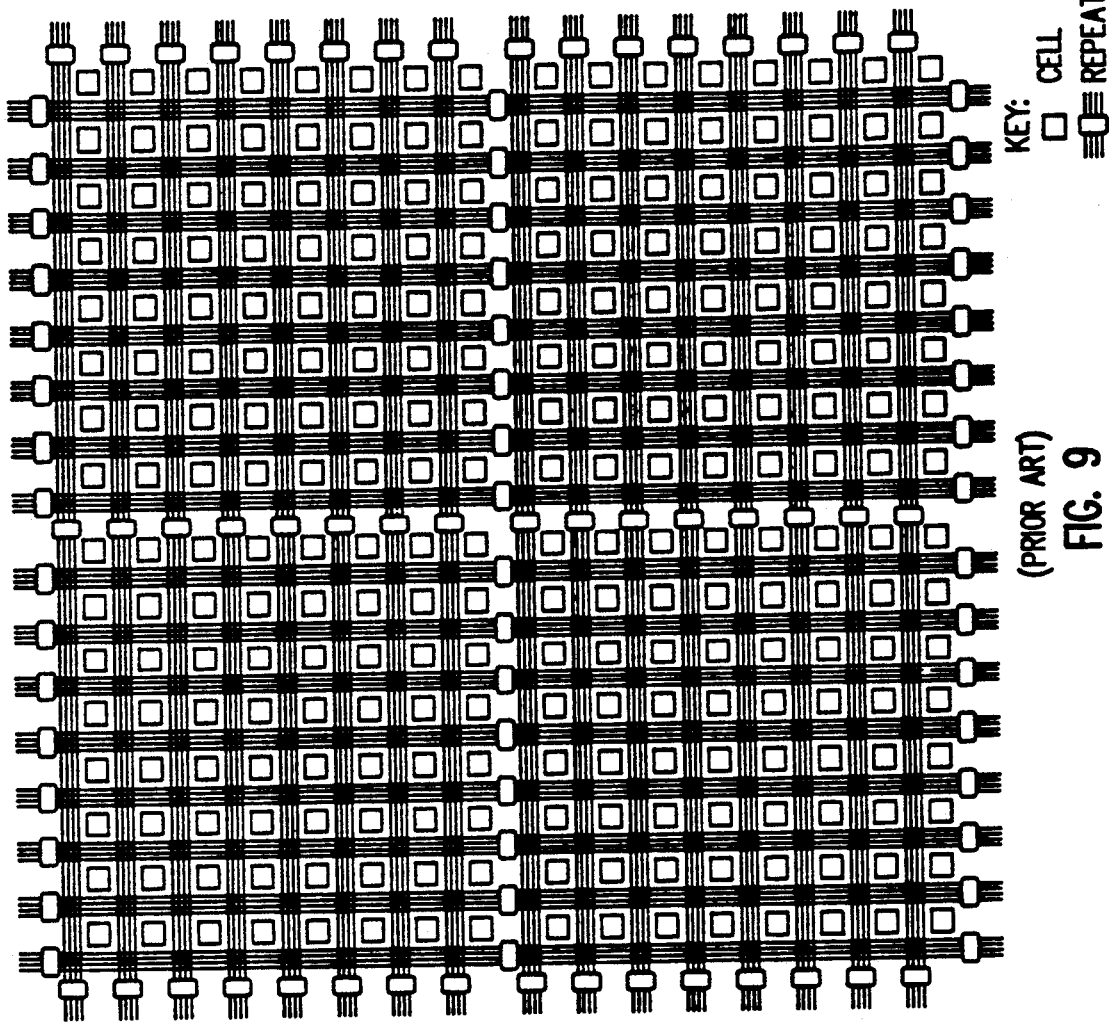
FIG. 9 (PRIOR ART)
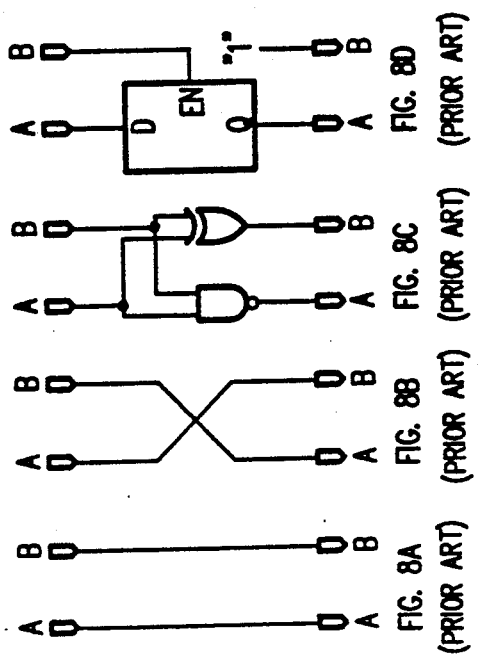
FIG. 8D (PRIOR ART)
FIG. 8C (PRIOR ART)
FIG. 8B (PRIOR ART)
FIG. 8A (PRIOR ART)

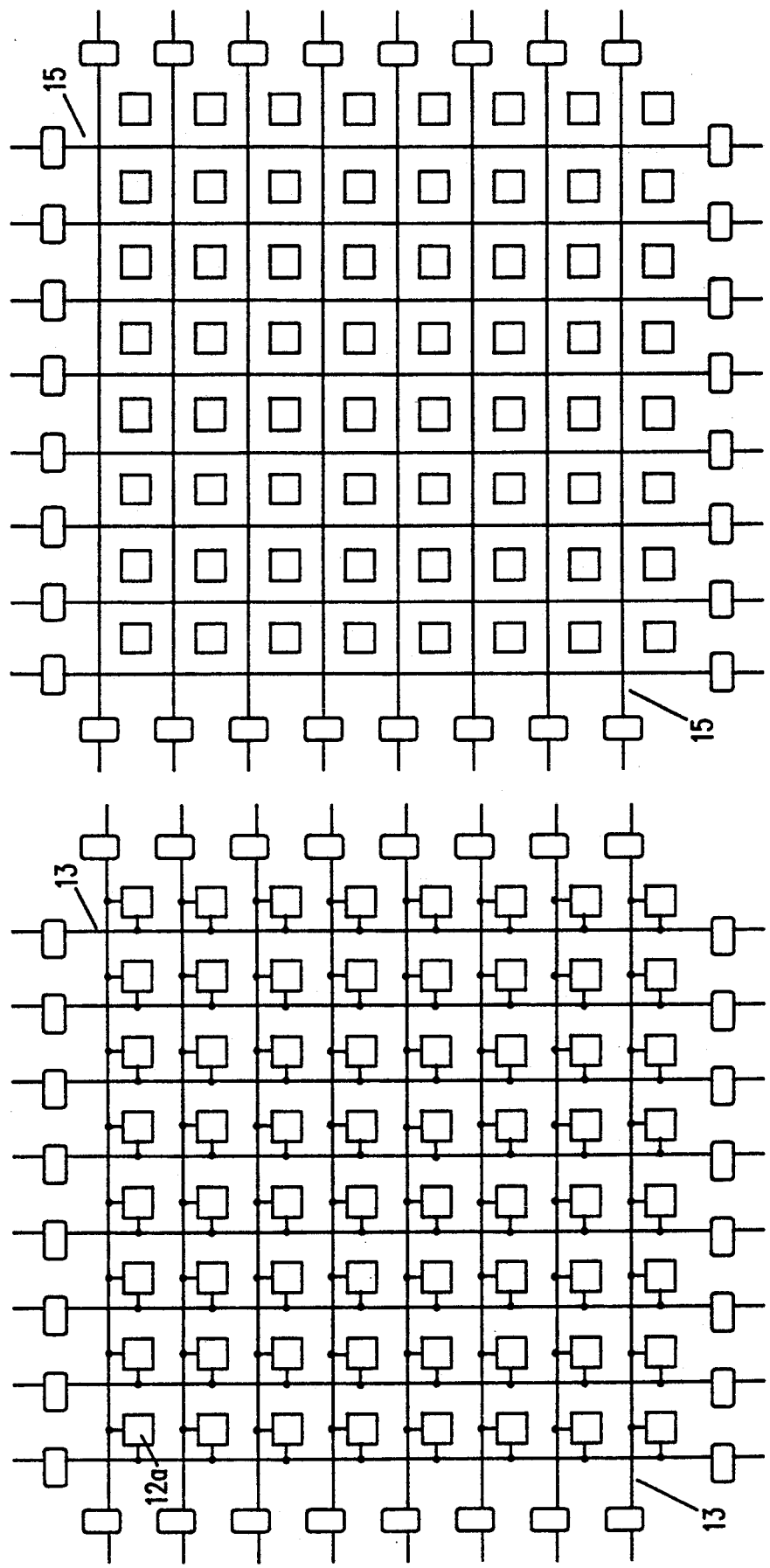

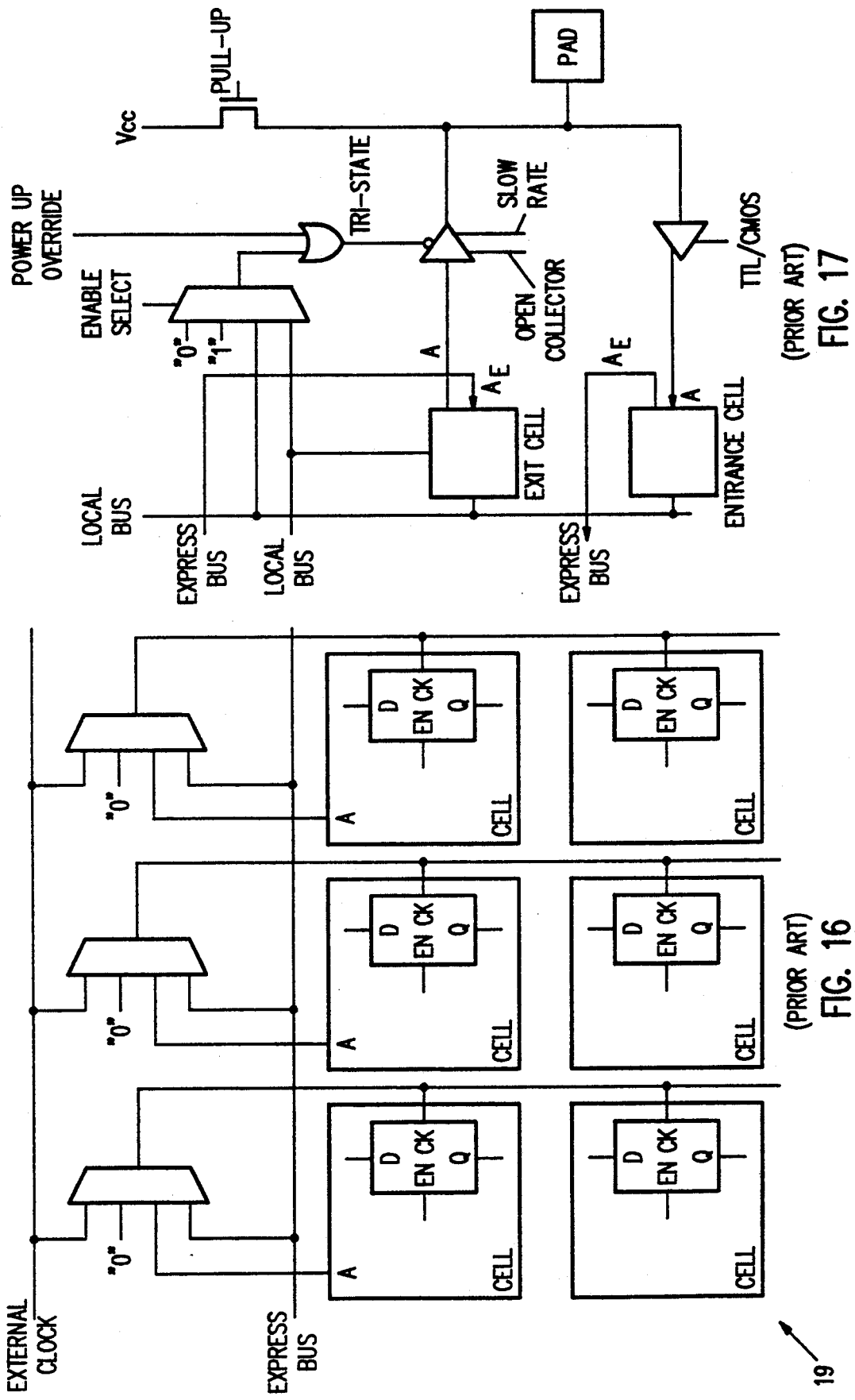

VERSATILE AND EFFICIENT CELL-TO-LOCAL BUS INTERFACE IN A CONFIGURABLE LOGIC ARRAY

This is a continuation-in-part of co-pending application Ser. No. 07/752,282 filed on Aug. 29, 1991 abandoned.

BACKGROUND OF THE INVENTION

1. Field of the Invention

The present invention relates generally to user programmable integrated circuit devices and, in particular, to an efficient, highly-versatile programmable bussing resource for a programmable logic array that allows use of bussing resources as either inputs or outputs to a cell in the array, allows routing of signals between cells, and also allows connection between different busses without effecting the normal use of the cell.

2. Discussion of the Prior Art

A configurable logic array (CLA) is a matrix of interconnected, programmable logic cells. The individual logic function and the active inputs and outputs of each logic cell are determined by parameter flip-flops and logic gates within the cell, rather than by physically customizing the array during manufacture. Thus, the individual cell functions and the interconnections between cells are dynamically programmable to provide a wide variety of functions. The greater the number of cells in the array, the greater the functional flexibility of the CLA device.

The configurable logic array concept was first introduced by Sven E. Wahlstrom in 1967. Wahlstrom, Electronics, Dec. 11, 1967, pp. 90–95.

Since then, Xilinx Inc., Actel Inc., Pilkington Microelectronics Ltd. and Concurrent Logic, Inc., among others, have proposed implementations of CLA devices.

The basic Xilinx CLA architecture is disclosed in U.S. Pat. No. 4,870,302, which issued to Ross H. Freeman on Feb. 19, 1988.

The CLA device described by the Xilinx '302 patent and shown in FIG. 1 includes an array of configurable logic elements that are variably interconnected in response to control signals to perform selected overall logic functions. Each configurable element in the array is capable of performing a number of logic functions depending upon the control information provided to that element. The array can have its function varied at any time by changing its control information.

FIG. 2 shows a CLA interconnect structure currently utilized in the Xilinx array. In addition to the single-length interconnect lines between logic elements, as shown in FIG. 2, the Xilinx array utilizes lines that connect switch matrices, e.g., two vertical and two horizontal double-length lines per logic-element column. The Xilinx array also utilizes "global" interconnect lines, e.g., six vertical global lines and six horizontal global lines per logic-element column, for clocks, resets and other global signals. Two of the horizontal global lines may be placed in a high impedance state.

FIG. 3 shows a logic-element currently utilized in the Xilinx array. The Xilinx logic element has three function generators, two flip-flops, and several multiplexers. The first two function generators can perform a Boolean function of four inputs. The function generators are implemented as memory look-up tables. The outputs of these two function generators are provided to the multiplexers and to a three-input function generator which can perform a Boolean function of G', F', and an external input. The output of the third function generator is also provided to the multiplexers. The multiplexers select whether the signals are provided to the output of the logic element or to the input of the flip-flops. The flip-flops have common clock, enable, and set or reset inputs. The configuration bits that determine the function of the logic element also determine how the C1 through C4 inputs are mapped into the four inputs: H1, DIN, S/R, and EC.

The basic Pilkington CLA architecture is disclosed in U.S. Pat. No. 4,935,734, which issued to Kenneth Austin on Sep. 10, 1986.

An implementation of the CLA architecture disclosed in the Pilkington '734 patent is shown in FIG. 4. Each logic element in the Pilkington array accepts inputs from four other logic elements in the illustrated pattern. Each logic element output drives multiple other elements as illustrated. In the array disclosure in the 734 patent, there is no additional wiring. However, the Plessey Company, under license from Pilkington, has marketed a product wherein bus wiring is added as shown in FIG. 4; i.e. in every third column, a bus provides inputs to every right-direction logic element in that column, and every third row has a bus providing inputs to every left-direction logic element in that row.

FIG. 5 shows a logic cell currently utilized in the FIG. 4 array. As shown in FIG. 5, each of the two inputs to a NAND gate are provided by a user configured multiplexer the inputs of which are provided by other logic elements or inputs. Plessey has also added circuitry to the logic element to permit it to be a latch or a 2-input NAND gate.

The basic Actel CLA architecture is disclosed in U.S. Pat. No. 4,873,459, issued to El Gamal et al on Oct. 10, 1989.

The Actel architecture relies on one-time programmable anti-fuses for configurability and, thus, is not re-programmable.

The Concurrent Logic, Inc. (CLI) CLA architecture, which is most relevant to the present invention, is discussed below in conjunction with FIGS. 6–17 Features of the CLI CLA architecture are disclosed in the following U.S. patents issued to Frederick C. Furtek: U.S. Pat. No. 4,700,187, issued Oct. 13, 1987; U.S. Pat. No. 4,918,440, issued Apr. 17, 1990; and U.S. Pat. No. 5,019,736, issued May 28, 1991.

As discussed in above-cited related application Ser. No. 07/608,415, a CLA may be viewed as an array of programmable logic on which a flexible bussing network is superimposed. As shown in FIG. 6, the heart of the CLI CLA 10 is a two-dimensional array of logic cells 12 each of which receives inputs from and provides outputs to its four adjacent neighbors. The core logic cell 12, which is shown in detail in FIG. 7, can be programmed to provide all the wiring and logic functions needed to create any digital circuit.

Each logic cell 12 in the array, other than those on the periphery, receives eight inputs from and provides eight outputs to its North (N), East (E), South (S), and West (W) neighbors. These sixteen inputs and outputs are divided into two types, "A" and "B", with an A input, an A output, a B input and a B output for each neighboring cell 12. Between cells 12, an A output is always connected to an A input and a B output is always connected to a B input.

As further shown in FIG. 7, within a cell 12, the four A inputs enter a user-configurable multiplexer 14, while the four B inputs enter a second user-configurable multiplexer 16. The two multiplexer outputs feed the logic components of the cell 12. In logic cell 12, these components include a NAND gate 18, a register 20, an XOR gate 22, and two additional user-configurable multiplexers 24 and 26.

The two four-input multiplexers 24 and 26 are controlled in tandem (unlike the input multiplexers), giving rise to four possible logic configurations, shown in FIGS. 8A–8D.

In the FIG. 8A configuration, corresponding to the "0" inputs of the multiplexers 24 and 26, the A outputs are connected to a single A input and the B outputs are connected to a single B input.

In the FIG. 8B configuration, corresponding to the "1" inputs of the multiplexers 24 and 26, the A outputs are connected to a single B input and the B outputs are connected to a single A input.

In the FIG. 8C configuration, corresponding to the "2" inputs of the multiplexers 24 and 26, the A outputs provide the NAND and the B outputs the XOR of a single A input and a single B input. This is the equivalent of a half adder circuit.

In the FIG. 8D configuration, corresponding to the "3" inputs of the multiplexers 24 and 26, the Q output of edge-triggered D flip-flop 20 is connected to the A outputs, the D input of the flip-flop 20 is connected to a single A input, the enable (EN) input of the flip-flop 20 is connected to a single B input and the B outputs provide the logical constant "1". A global clock input and register reset are provided for this configuration, but is not illustrated in FIG. 8D. This configuration is equivalent to a one bit register.

The cell 12 thus provides the most fundamental routing and logic functions: extensive routing capabilities, NAND and XOR (half adder), a one-bit register, the logical constant "1", and fan-out capabilities.

These functions permit the basic CLA array 10 to implement arbitrary digital circuits. A register and half adder (NAND and XOR) included in each cell 12, together with a high cell density, make the array 10 well adapted for both register-intensive and combinatorial applications. In addition, signals passing through a cell 12 are always regenerated, ensuring regular and predictable timing.

Although the basic logic array 10 is completely regular, routing wires through individual cells 12 can cause increased delays over long distances. To address this issue, the neighboring interconnect provided by the array 10 is augmented with three types of programmable busses: local, turning, and express.

Local busses provide connections between the array of cells and the bussing network. They also provide the wired-AND function.

Turning busses provide for 90° turns within the bussing network enabling T-intersections and corners. Turning busses provide faster connections than do local busses, since they do not have the delays associated with using a cell as a wire.

Express busses are designed purely for speed. They are the fastest way to cover straight-line distances.

There is one bus of each type described above for each row and each column of logic cells 12 in the array 10. Connective units, called repeaters, are spaced every eight cells 12 and divide each bus into segments spanning eight cells 12. Repeaters are aligned into rows and columns, thereby partitioning the basic array 10 into 8×8 blocks of cells 12 called "superblocks". FIG. 9 illustrates a simplified view of a bussing network containing four superblocks. Cell-to-cell connections are not shown.

As shown in FIG. 10, each local bus segment 13 is connected to eight consecutive cells 12. As shown in FIG. 11, each turning bus segment 15 is connected to eight orthogonal turning busses through programmable turn points. As shown in FIG. 12, each express bus segment 17 is connected only to the repeaters at either end of the 8×8 superblock. FIG. 13 shows the three types of busses combined to form the bussing network of the array 10.

In order for the bussing network to communicate with the array 10, each core logic cell 12 is augmented as shown in FIG. 14 to permit the reading and writing of local busses L. The cell 12 reads a horizontal local bus through the "$L_X$" input of the B input multiplexer 16 and reads a vertical local bus through the "$L_Y$" input of the B input multiplexer 16. The cell 12 writes to a local bus through the driver 28 connected to the A output.

While the cell 12 may read either a horizontal or a vertical bus under program control, the cell 12 may write to only one bus of fixed orientation. Whether a cell 12 writes to a horizontal or vertical bus is determined by its location with the array 10. Referring back to FIG. 10, the cell 12 in the upper-left corner of the illustrated superblock writes to a horizontal local bus. If a particular cell 12 writes to a horizontal local bus, then its four immediate neighbors write to vertical local busses, and vice versa.

As shown in FIG. 13, the two types of cells 12 are thus arranged in a checker-board pattern where the black cells 12 write to horizontal busses and the white cells 12 write to vertical busses.

The CLA busses can be driven by the bus driver 28 in two ways. The bus driver 28 has two control bits, "TS" and "OC", which provide high impedance and open-collector capabilities, respectively. The high impedance capability, which is independently programmable for each cell 12, allows the bus driver to be disconnected from the bus when the cell 12 is not being used to write to the bus.

The open-collector capability provides the wired-AND function when multiple cells 12 are driving the same local bus simultaneously. Unlike the high impedance function, which is controlled at the cell level, the open-collector function is controlled at the bus level; all cells 12 driving the same local bus are in the same open-collector state. The programming environment insures that if there is exactly one driver 28 driving a local bus, then that driver 28 provides active pull-up and active pull-down. (The open-collector capability is turned off.) In all other cases, the drivers 28 driving a local bus provide passive pull-up and active pull-down. (The open-collector capability is turned on.)

In the special case when there are no drivers 28 driving a local bus (that is, when the bus is not used), the open-collector capability is turned on and the bus is pulled high through the passive pull-up resistor. An unused local bus, therefore, provides a logical "1" to those cells reading the bus.

As stated above, repeaters provide connections between busses. Each repeater is programmable so that any bus on one side of a repeater can be connected to any bus on the other side of the repeater, as shown in FIG. 15. Each connection is unidirectional (direction is not depicted in FIG. 15) since repeaters always provide signal regeneration. The direction, like the connection itself, is programmable. Including direction, there are 18 (2×9) repeater configurations providing one connection, 72 (4×18) providing two connections, and 48 (8×6) providing three connections.

As shown in FIG. 16, logic 19 for distributing clock signals to the D flip-flops 20 in the logic cells 12 is located along one edge of the array 10. The distribution network is organized by column and permits columns of cells 12 to be independently clocked. At the head of each column is a user-configurable multiplexer 30 providing the clock signal for that column. There are four inputs to each multiplexer 30: an external clock supplied from off chip, the logical constant "0", the express bus adjacent to the distribution logic, and the A output of the cell 12 at the head of the corresponding column.

Through the global clock, the network provides low-skew distribution of an externally supplied clock to any or all of the columns of the array 10. The constant "0" is used to reduce power dissipation in columns containing no registers. The express bus is useful in distributing a secondary clock to multiple columns when the external clock line is used as a primary clock. The A output of a cell is useful in providing a clock signal to a single column.

All D flip-flops 20 of the cells 12 of the array 10 may be globally reset through an externally supplied signal entering the RESET control pin.

The CLA array 10 provides a flexible interface between the logic array, configuration control logic and the I/O pads of the CLA device. As shown in FIG. 17, two adjacent cells, an "exit" cell 12a and an "entrance" cell 12b, on the perimeter of the logic array are associated with each I/O pad 32. The A output of the exit cell 12a is connected, under program control, to an output buffer 34. The edge-facing A input of the adjacent entrance cell 12b is connected to an input buffer 36. The output of the output buffer 34 and the input to the input buffer 36 are both connected to the I/O pad 32. Control of the I/O logic is provided by various control signals and bits, as shown in FIG. 17.

While the CLA array 10 described above provides a wide range of configuration options, it would be desireable to have available a CLA device that provides an even greater level of programmable flexibility.

The present invention provides a low transistor count programmable bossing resource for a programmable logic array that allows the use of the bussing resources as inputs or outputs to a cell in the array and allows connections between different busses without effecting the normal use of the cell. The bussing resource allows efficient routing of signals between and is symmetric to allow rotation of logic macros built using combinations of cells and busses.

A better understanding of the features and advantages of the present invention will be obtained by reference to the following detailed description and accompanying drawings which set forth an illustrative embodiment in which the principles of the invention are utilized.

DESCRIPTION OF THE DRAWINGS

FIGS. 8A-8D are simple logic diagrams illustrating four possible logic configurations of the FIG. 7 logic cell.

FIG. 9 is a schematic diagram illustrating a bussing network for the FIG. 6 CLA array.

FIG. 10 is a schematic diagram illustrating local bus segments for the FIG. 9 bussing network.

FIG. 11 is a schematic diagram illustrating turning bus segments for the FIG. 9 bussing network.

FIG. 16 is a block diagram illustrating clock distribution logic utilizable in the FIG. 6 CLA array.

FIG. 17 is a logic diagram illustrating "exit" and "entrance" cells associated with each I/O pad of the FIG. 6 CLA array.

DETAILED DESCRIPTION OF THE INVENTION

Figure 1:
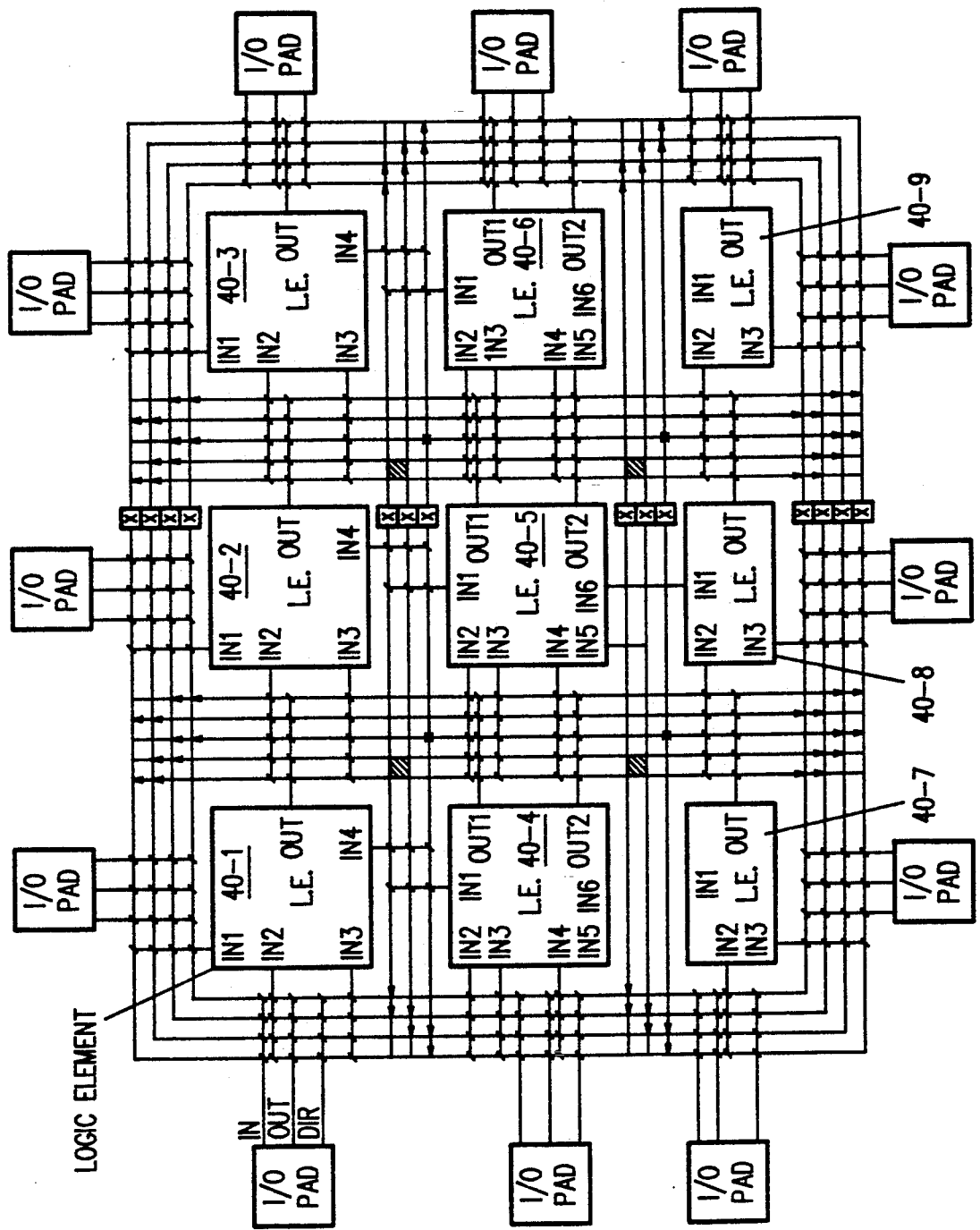
FIG. 1 is a block diagram illustrating a portion of a first type of conventional configurable logic array architecture.
Figure 2:
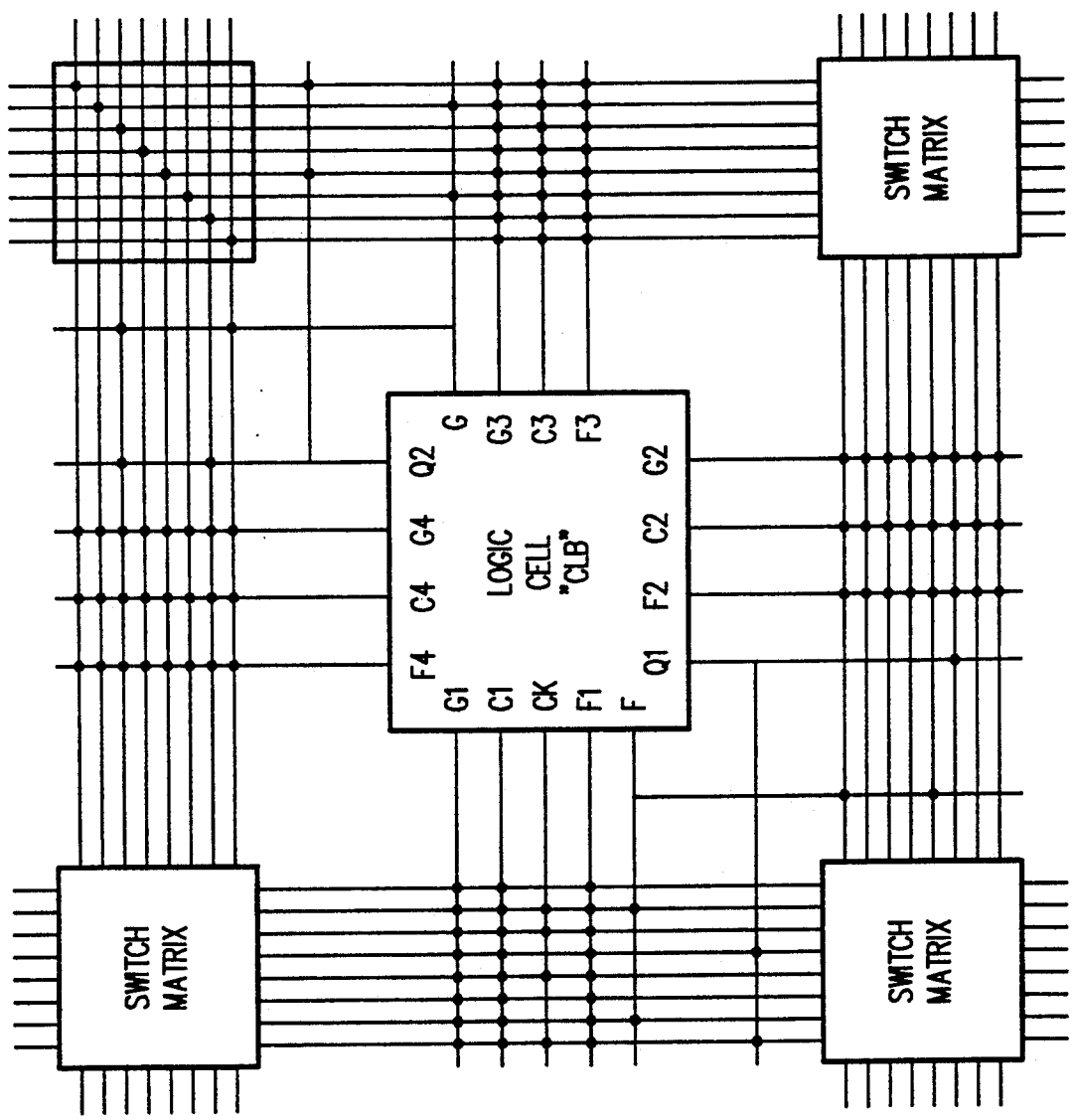
FIG. 2 is a schematic diagram illustrating a cell-to-cell interconnect structure utilizable in the FIG. 1 CLA array.
Figure 3:
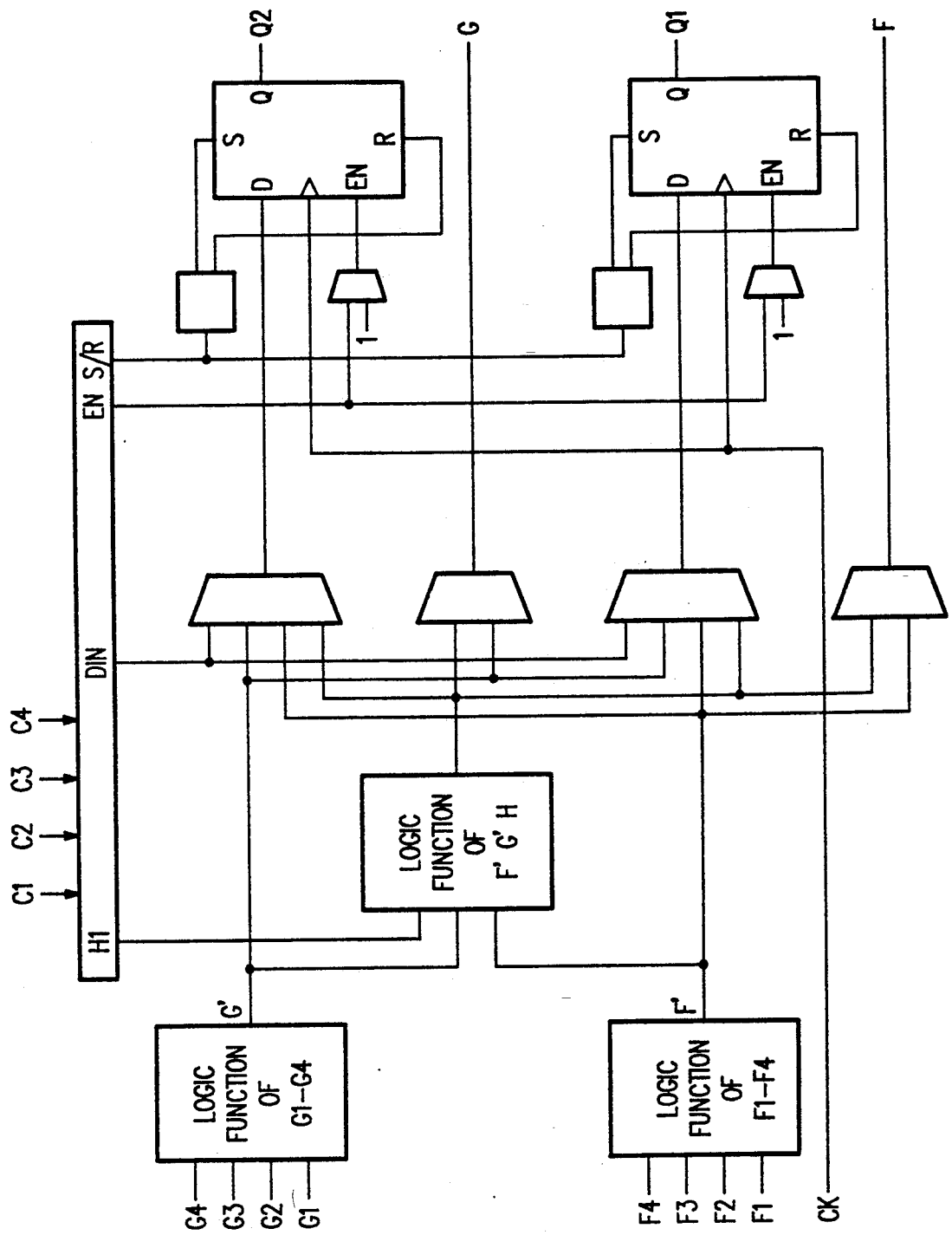
FIG. 3 is a logic diagram illustrating a logic cell utilizable in the FIG. 1 CLA array.
Figures 4, 5:
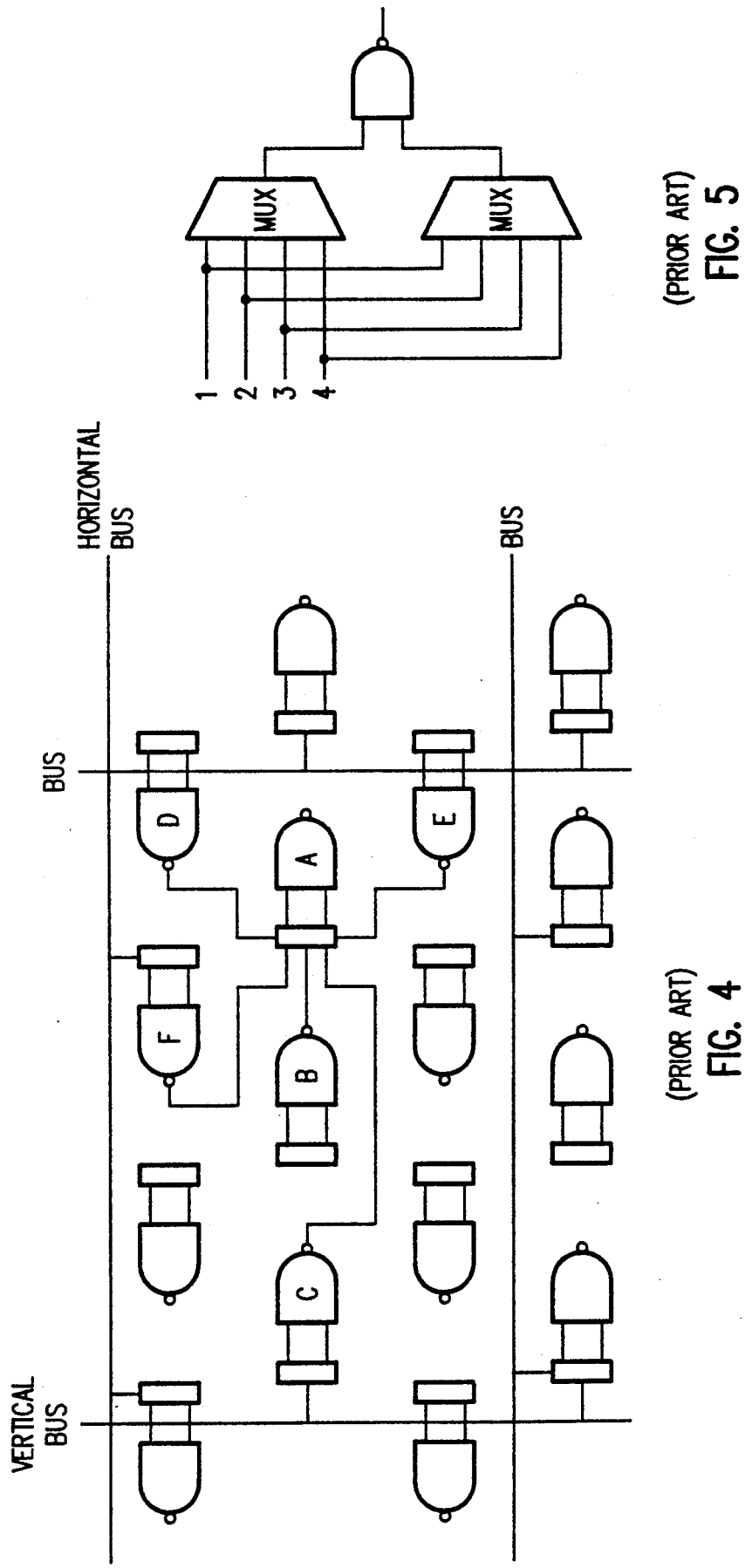
FIG. 4 is a logic diagram illustrating a portion of a second type of conventional configurable logic array architecture.
FIG. 5 is a logic diagram illustrating a logic cell utilizable in the FIG. 4 CLA array.
Figures 6, 7:
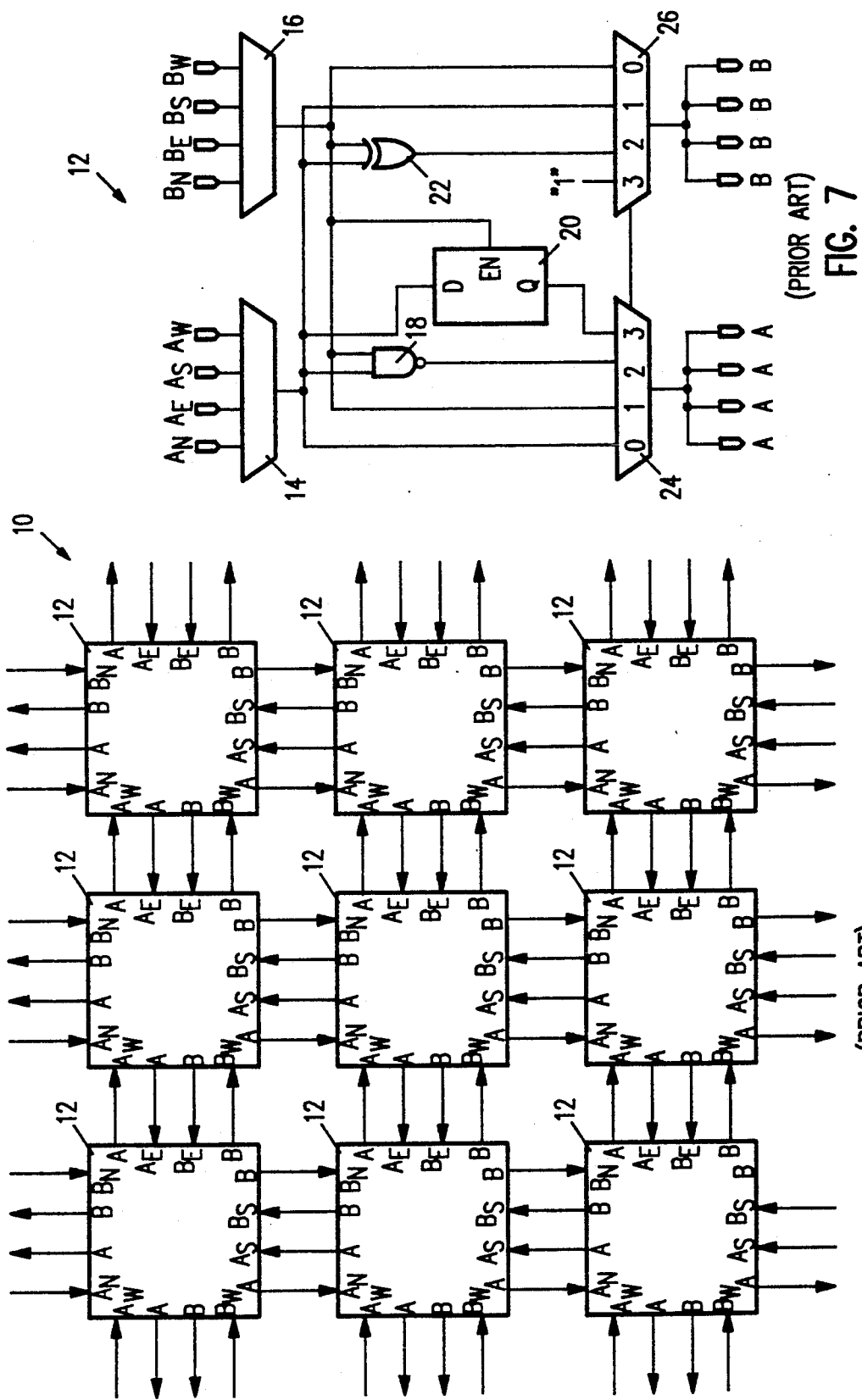
FIG. 6 is a block diagram illustrating a portion of third type of conventional configurable logic array.
FIG. 7 is a logic diagram illustrating a logic cell utilizable in the FIG. 6 CLA array.
Figures 12, 13:
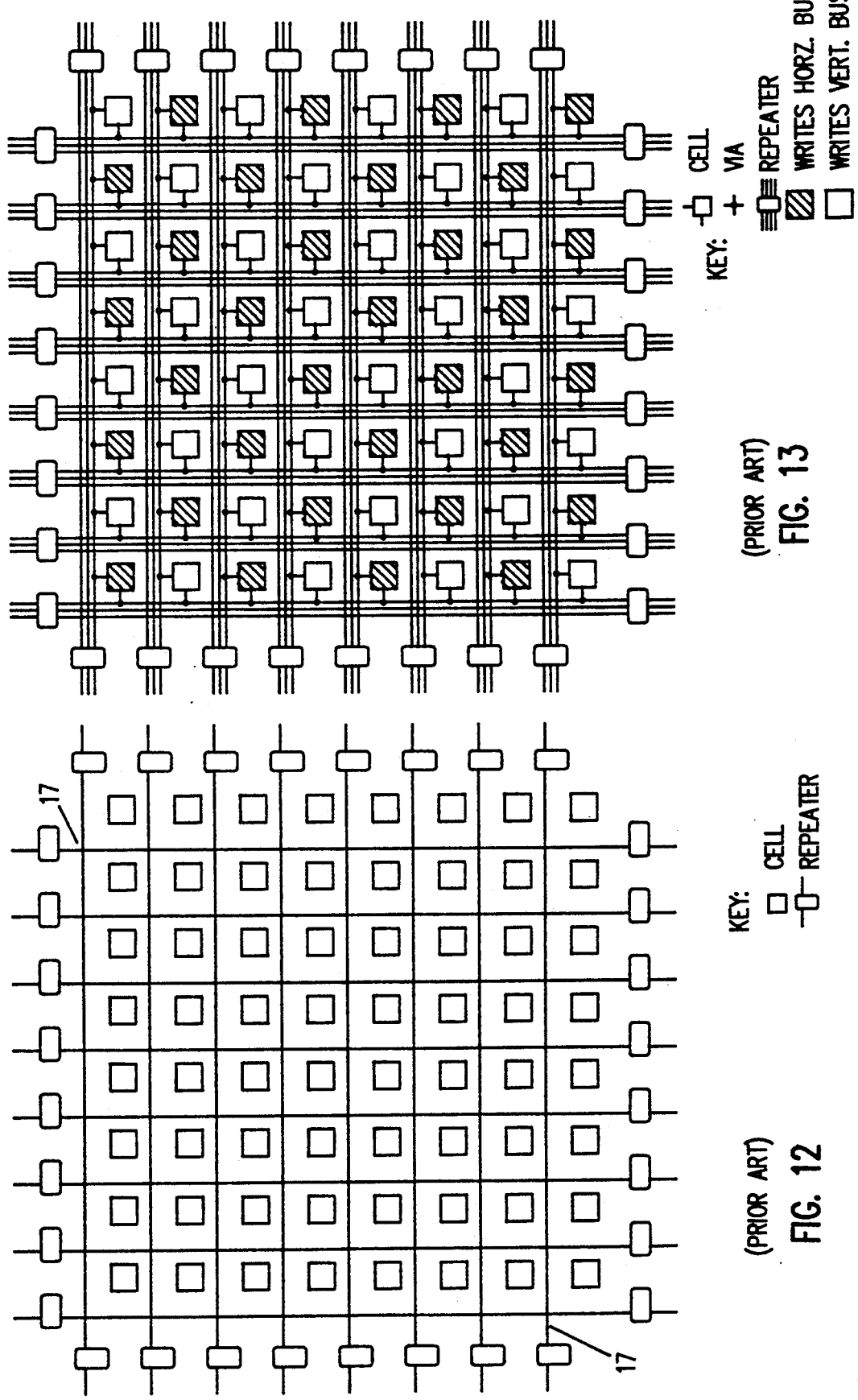
FIG. 12 is a schematic diagram illustrating express bus segments for the FIG. 9 bussing network.
FIG. 13 is a schematic diagram illustrating of the combination of the local, turning and express bus segments of the FIG. 9 bussing network.
Figure 15:
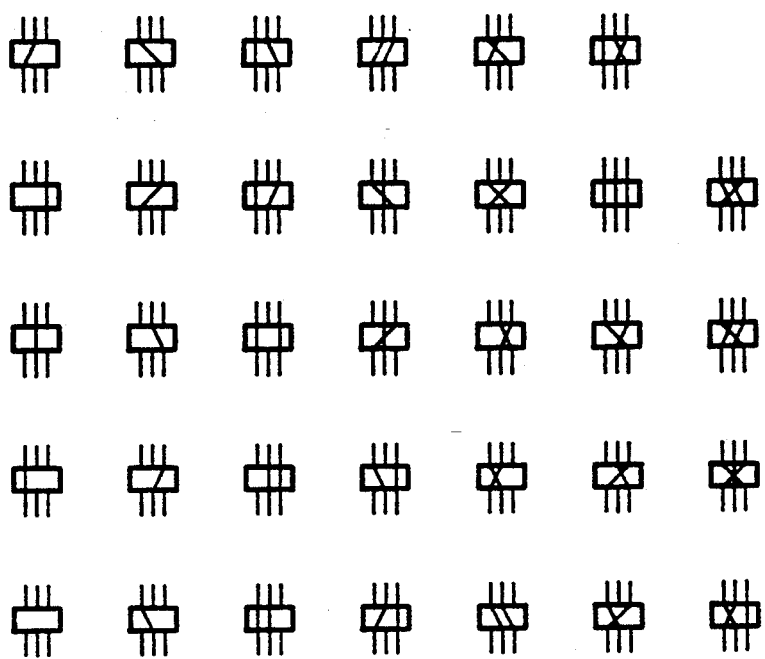
FIG. 15 illustrates the multiple possible repeater configurations for inter-bus connections in the FIG. 9 bussing network.
Figure 14:
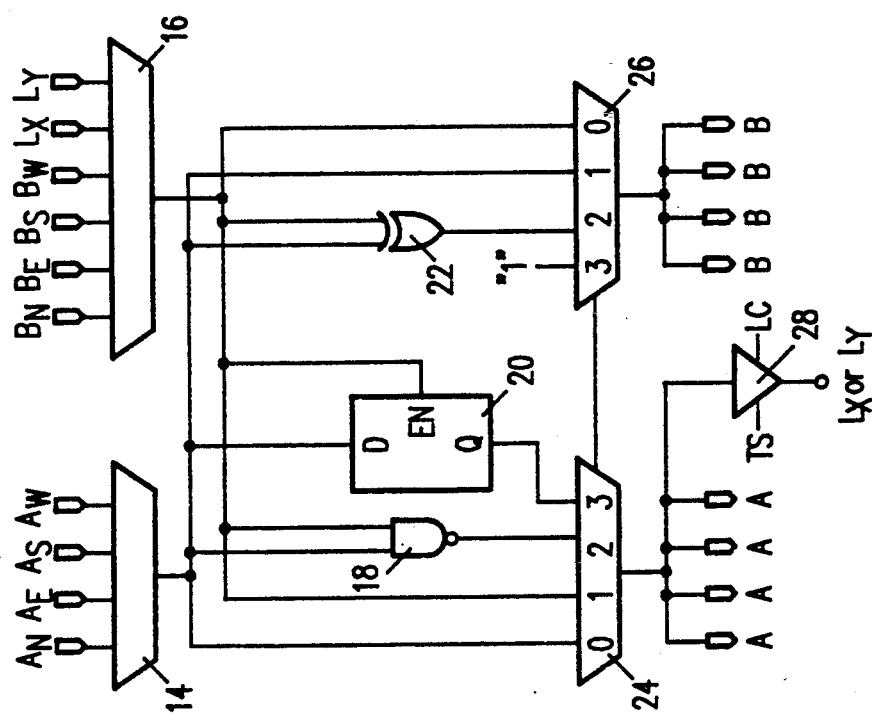
FIG. 14 is a schematic diagram illustrating the FIG. 7 logic cell augmented to permit read/write of local busses.
Figure 18:
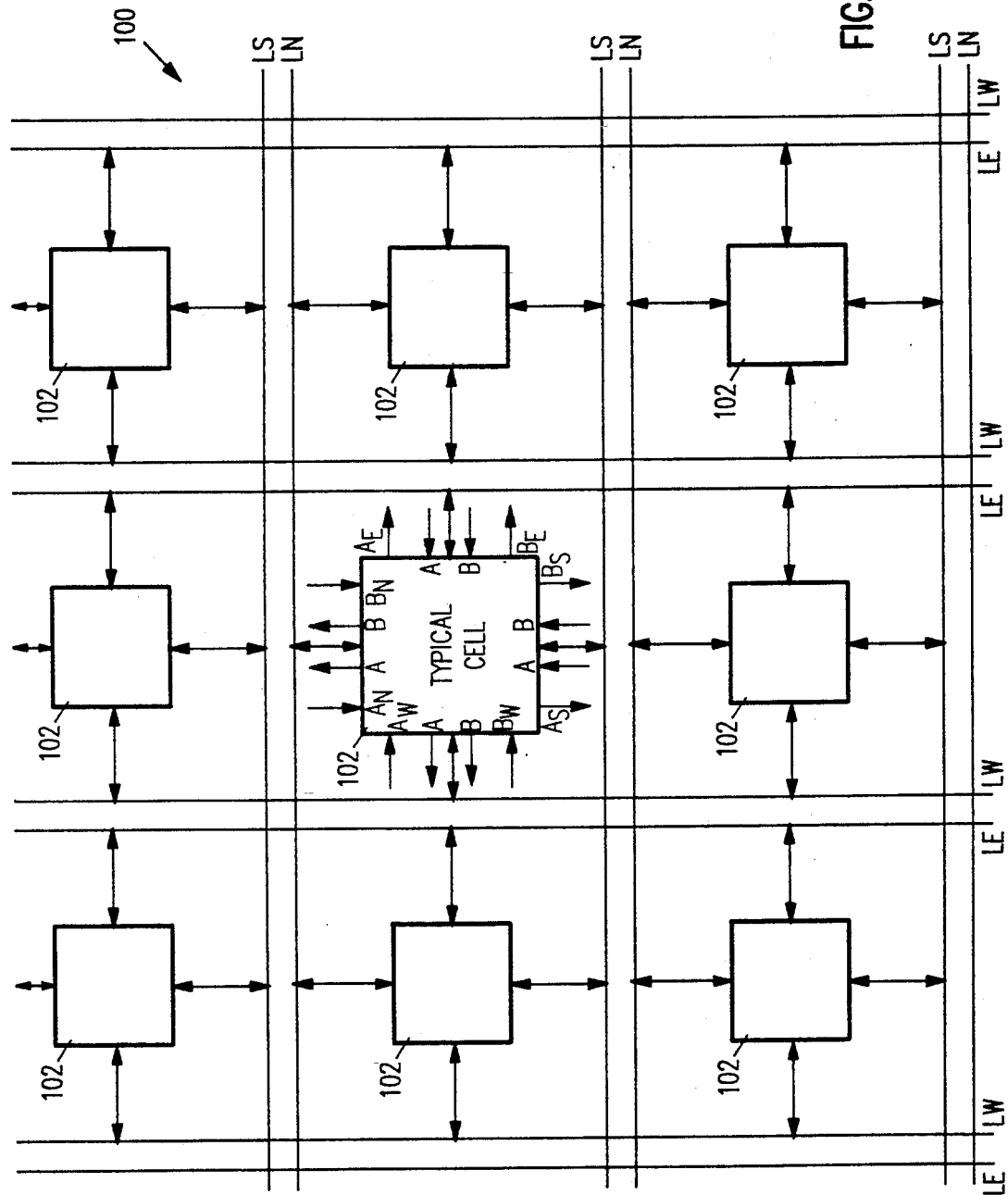
FIG. 18 is a block diagram illustrating a portion of a configurable logic array in accordance with the present invention.

FIG. 18 shows a configurable logic array 100 comprising a matrix of individual programmable logic cells 102. As shown by the "typical" logic cell 102 in FIG. 18, each logic cell 102 receives eight inputs from and provides eight outputs to its North (N), East (E), South (S) and West (W) neighbors.

These sixteen inputs and outputs are divided into two types, "A" and "B", with an A input, an A output, a B input and a B output for each neighboring cell. Between cells 102, an A output is always connected to an A input and a B output is always connected to a B input.

As further shown in FIG. 18, the CLA array 100 includes two local busses $L_N$, $L_S$ in the x direction and two local buses $L_D$, $L_W$ in the y direction running between each row and column of cells 102, respectively, in the array 100. Thus, each cell 102 has access to four local busses. The local busses allow efficient interconnections between cells 102 that are not nearest neighbors cells in the same row or column.

Any of these local busses may be active within any given cell 102. However, a cell's connections to local busses must be selected either only as inputs or only as outputs if they are used at all by the cell 102, except when used as a bus-to-bus connection or when the FIG. 21 alternative scheme, described below, is used. If selected as inputs, then only one of the local busses can be enabled. If selected as outputs, then a cell 102 can drive up to all four of its accessible local busses.

Figure 19:
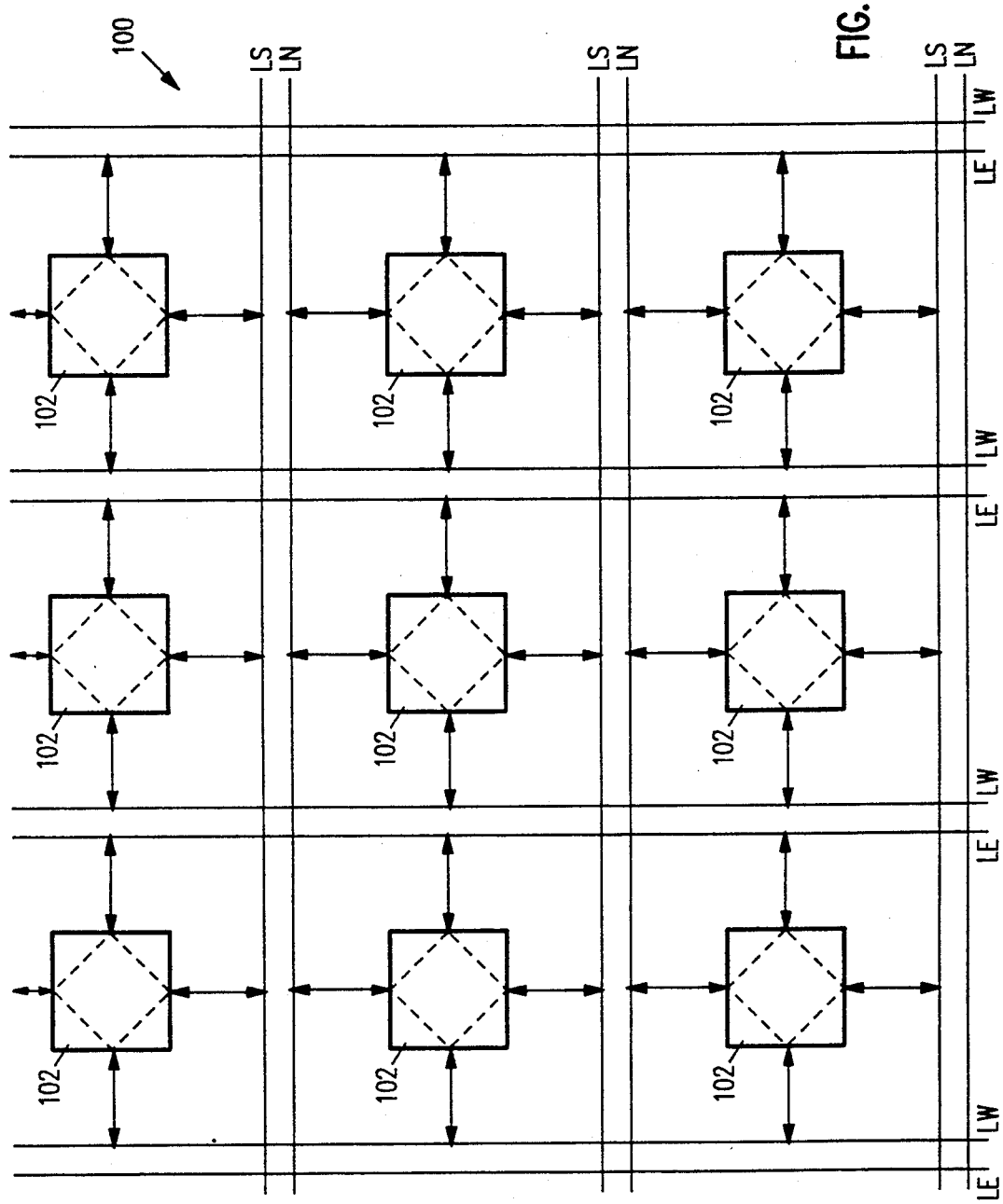
FIG. 19 is a block diagram illustrating the bus turning capability of a logic cell of the FIG. 18 CLA array.

As shown in FIG. 19, a cell 102 may allow a turn from a local bus $L_N$, $L_S$ running in the x direction to a local bus $L_E$, $L_W$ running in the y direction. This type of connection is useful when two nonneighboring cells 102 must be connected to one another and the cells 102 are not in the same row or the same column. In this case, the cell 102 that facilitates the turn cannot use the local busses as an input or an output. If a cell 102 is using its local busses for anything other than an input, then the output of the local bus input mux (Lin in FIG. 26) is forced to a "1."

Figure 20:
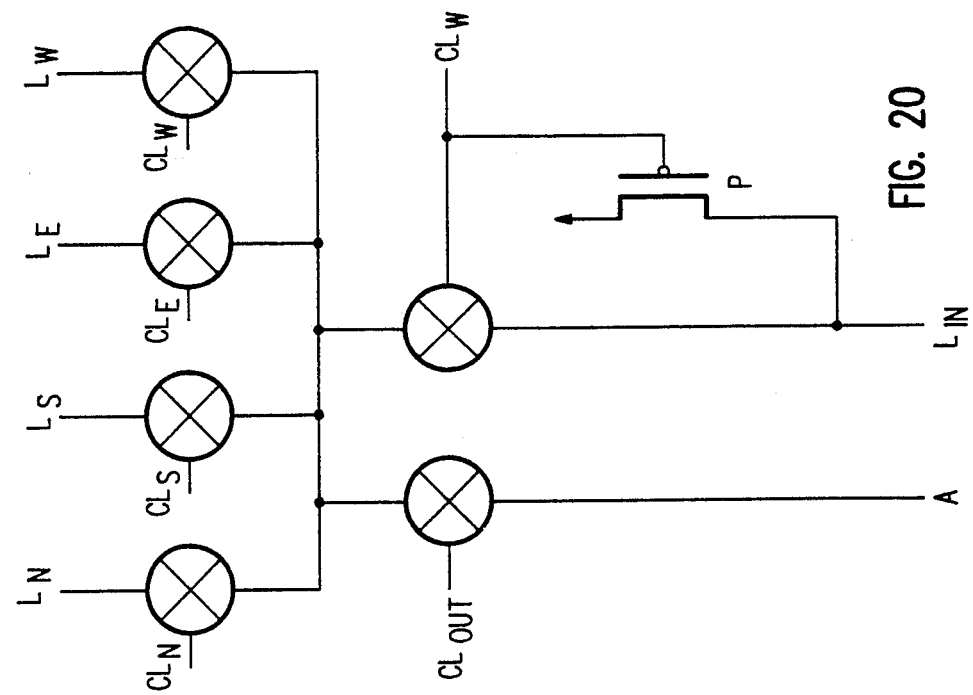
FIG. 20 is a schematic representation illustrating the interface between a cell and local busses in the FIG. 18 CLA array.

FIG. 20 shows the functional implementation of the interface between a cell 102 and the local busses.

As shown in FIG. 20, a cell 102 can drive signal A onto any combination of its associated local busses, $L_N$, $L_S$, $L_E$ and $L_W$ by activating various combinations of the transmission gates controlled by signals $CL_N$, $CL_S$, $CL_E$, $CL_W$ and $CL_{OUT}$. A cell 102 can receive input from any one of its associated local busses $L_N$, $L_S$, $L_E$ and $L_W$ by activating the transmission gate controlled by signal $CL_{IN}$ along with activating one of the transmission gates controlled by signals $CL_N$, $CL_S$, $CL_E$, and $CL_W$. If signal $CL_{IN}$ disables its transmission gate, then p-channel pullup transistor P provides a logic "1" level on signal Lin.

If the transmission gates controlled by signals $CL_{OUT}$ and $CL_{IN}$ are both disabled, then the local bus interface shown in FIG. 20 can facilitate a connection from any of its associated local busses to any or all others. This capability allows turns from a horizontal local bus to a vertical local bus.

The cell/bus connection scheme shown in FIG. 20 can be extended to accommodate a larger number of busses and to allow multiple simultaneous turns between horizontal and vertical busses.

Figure 20A:
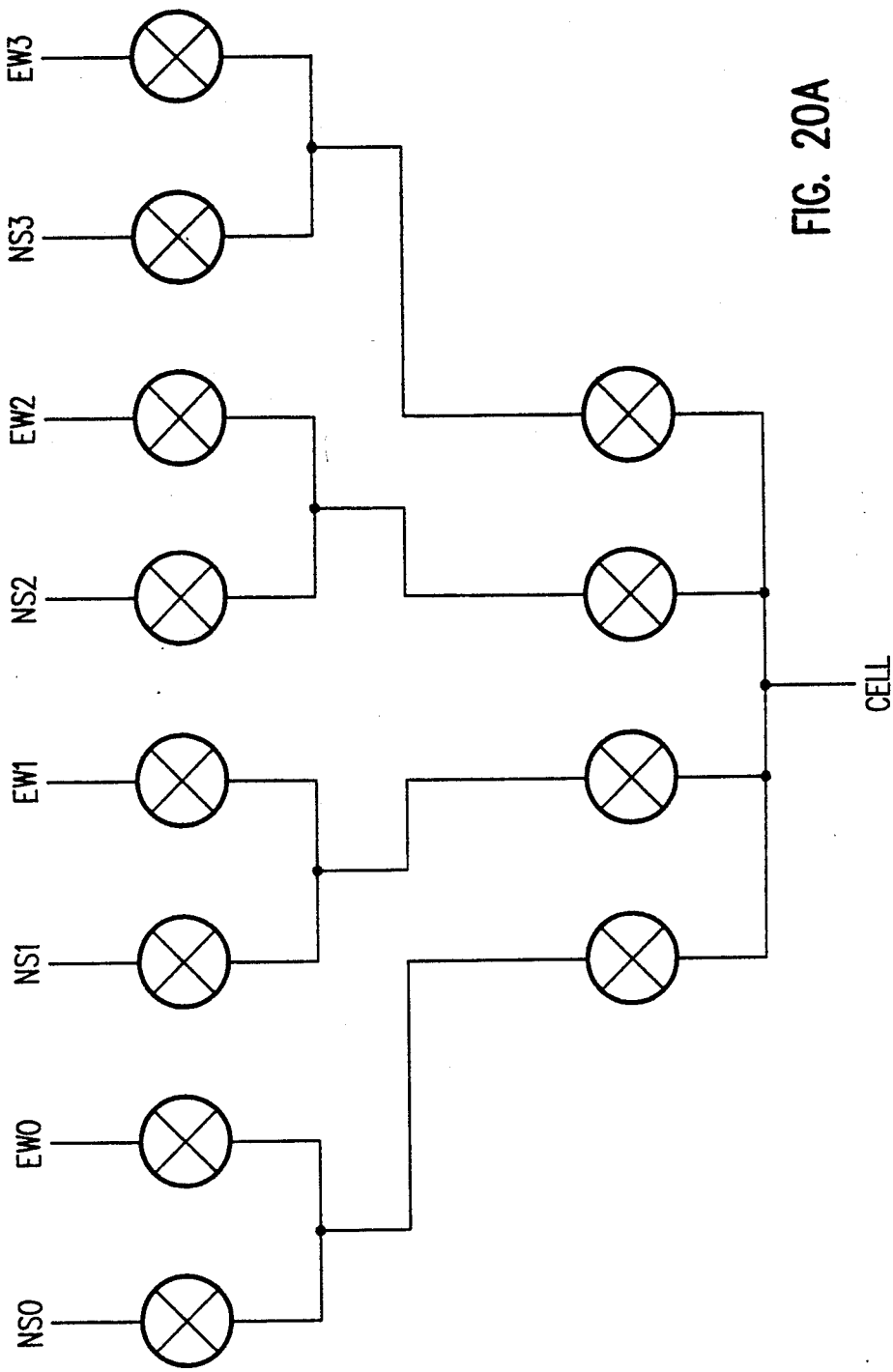
FIG. 20A is a schematic representation illustrating an alternate interface between a cell and the local buses of the FIG. 18 CLA array.

FIG. 20A illustrates an interface scheme that assumes four horizontal local buses (EW0, EW1, EW2 and EW3) and four vertical local buses (NS0, NS1, NS2 and NS3). For each pair of corresponding busses, e.g. NS0 and EW0, there are three bidirectional pass gates connected in a tree, as illustrated. Each of the eight upper pass gates, i.e. those connected directly to the busses, are controlled by a separate configuration bit. The four lower pass gates, i.e. those connected directly to the cell, may be controlled either by individual bits or, in order to conserve configuration bits, by control signals derived from the configuration bits controlling the upper pass gates.

For example, assume that "A" and "B" are the configuration bits controlling the upper pass gates associated with NS0 and EW0, respectively. Then either A XOR B or A NAND B can be used to control the corresponding lower pass gate. Note that, in both cases, the lower pass gate is turned off when both upper pass gates are turned on—this is a bus turn. Note also that when exactly one of the upper pass gates is turned on, the lower pass gate is also turned on—this is either a read or a write to the cell. When both upper pass gates are turned off, the state of the lower pass gate is a "don't care".

As in the FIG. 20 scheme, the FIG. 20A scheme uses the same pass gates for both reading and writing. In addition, however, it is now possible to have up to four simultaneous bus turns when the cell is not accessing the bus, or up to three simultaneous turns when the cell is accessing the bus.

Figure 21:
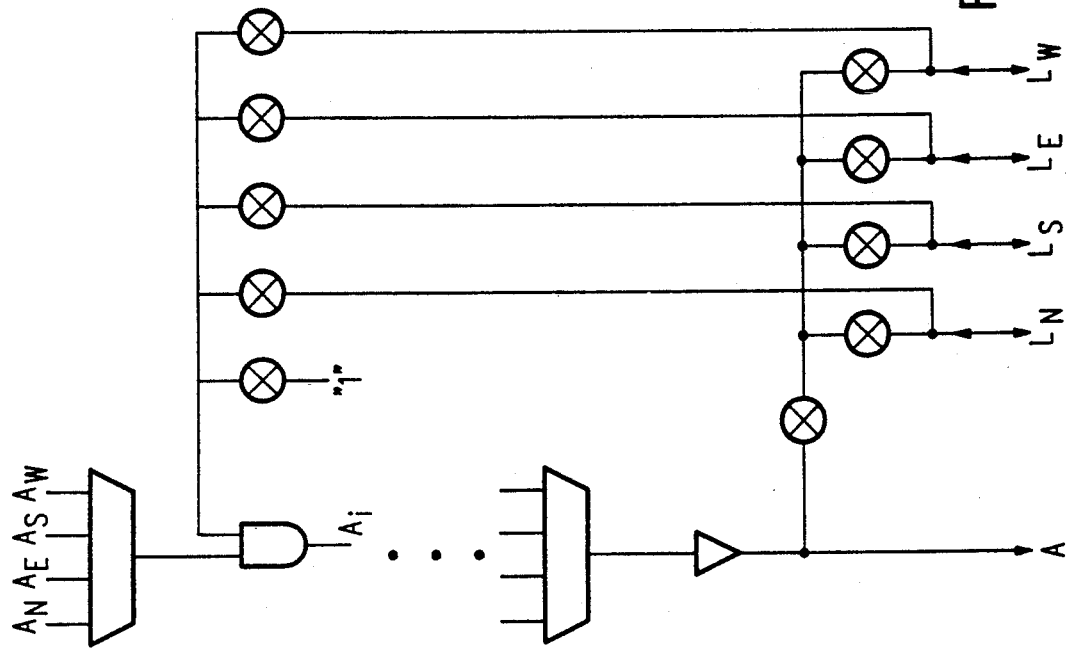
FIG. 21 is a schematic representation illustrating the implementation of individual control of the local busses in the FIG. 18 CLA array

Alternatively, as shown in FIG. 21, rather than constraining all four local bus connections to all being inputs or all being outputs, configuration memory and multiplexors can be added so that the bus connections can be individually controlled. In this way, one bus connection could be an input and, simultaneously, another bus connection could be an output in situations other then bus-to-bus connections. This would reduce the number of cells 102 required for routing in the array 100.

Figure 22:
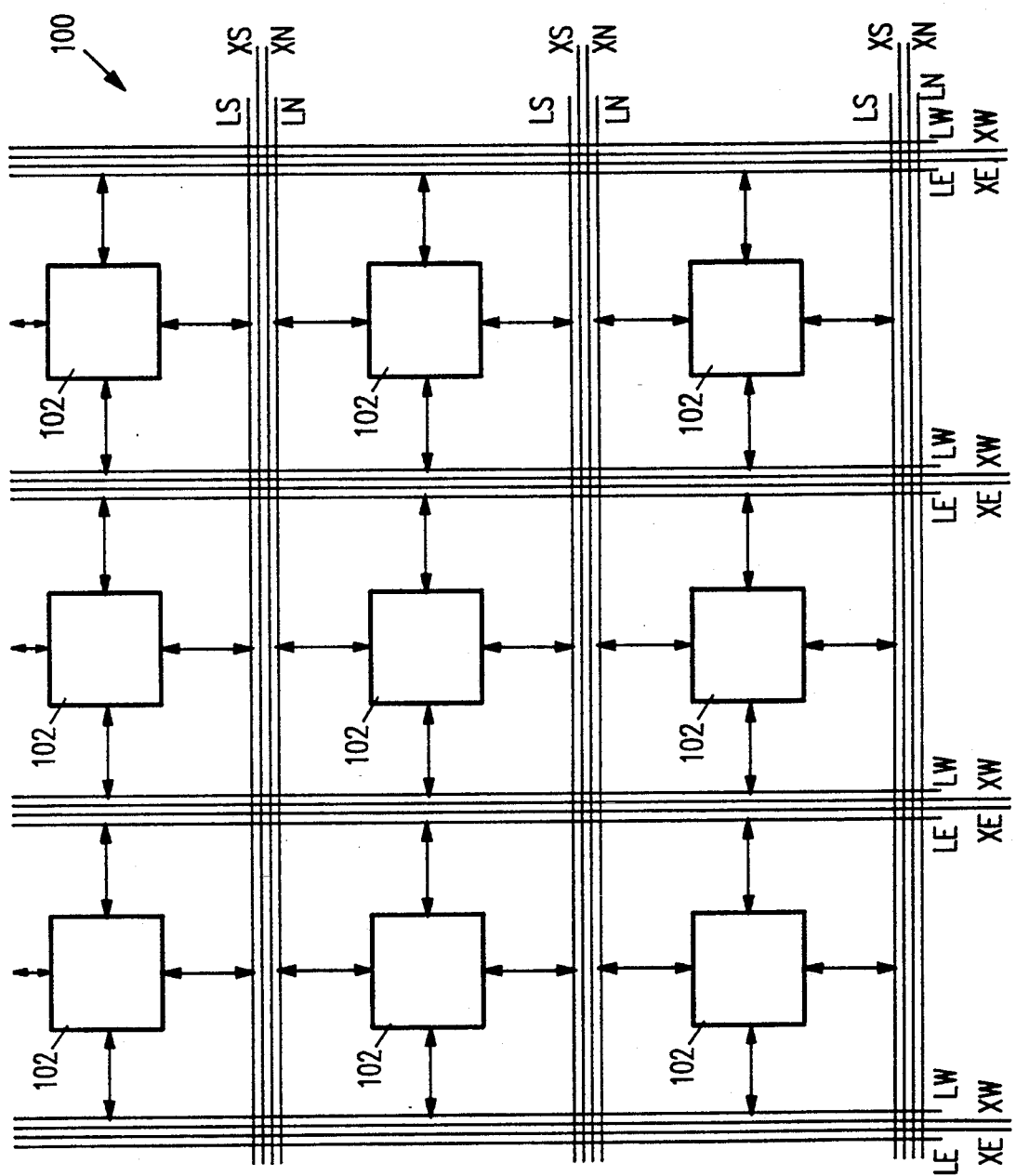
FIG. 22 is a block diagram illustrating express busses in the FIG. 18 CLA array.

As shown in FIG. 22, in addition to the local busses described above, the array 100 includes two express busses $X_N$, $X_S$ running in the x direction and two express busses $X_E$, $X_W$ running in the y direction between each row and column, respectively, of cells 102 in the array 100. Each express bus is associated with one local bus. Entry to/from an express bus is only possible from/to its associated local bus at the repeater.

Figure 23A:
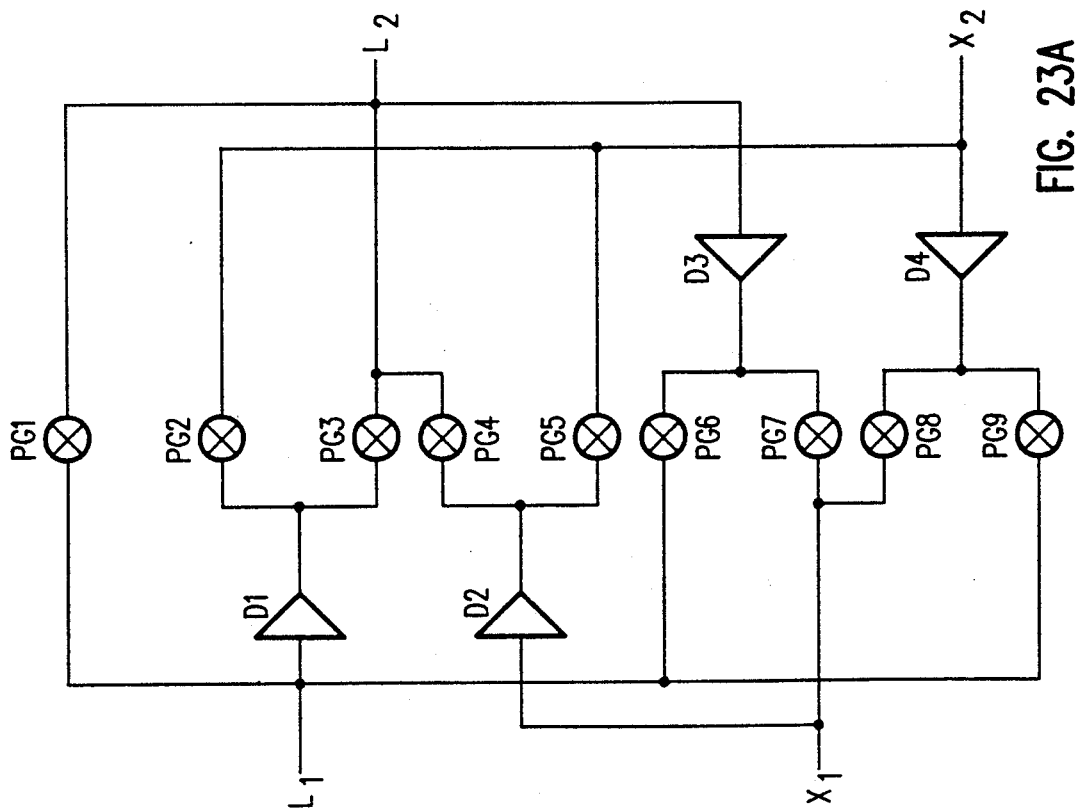
FIG. 23A is a schematic representation illustrating utilization of repeaters in the FIG. 18 CLA array.

As shown in FIG. 23A, repeaters R are spaced eight cells 102 apart. A block of cells 102 surrounded by repeaters R is referred to as a "superblock". An express bus allows a signal to travel a distance of eight cells 102 without additional variable loads, giving it the highest speed possible for the full length of the superblock.

Figure 23B:
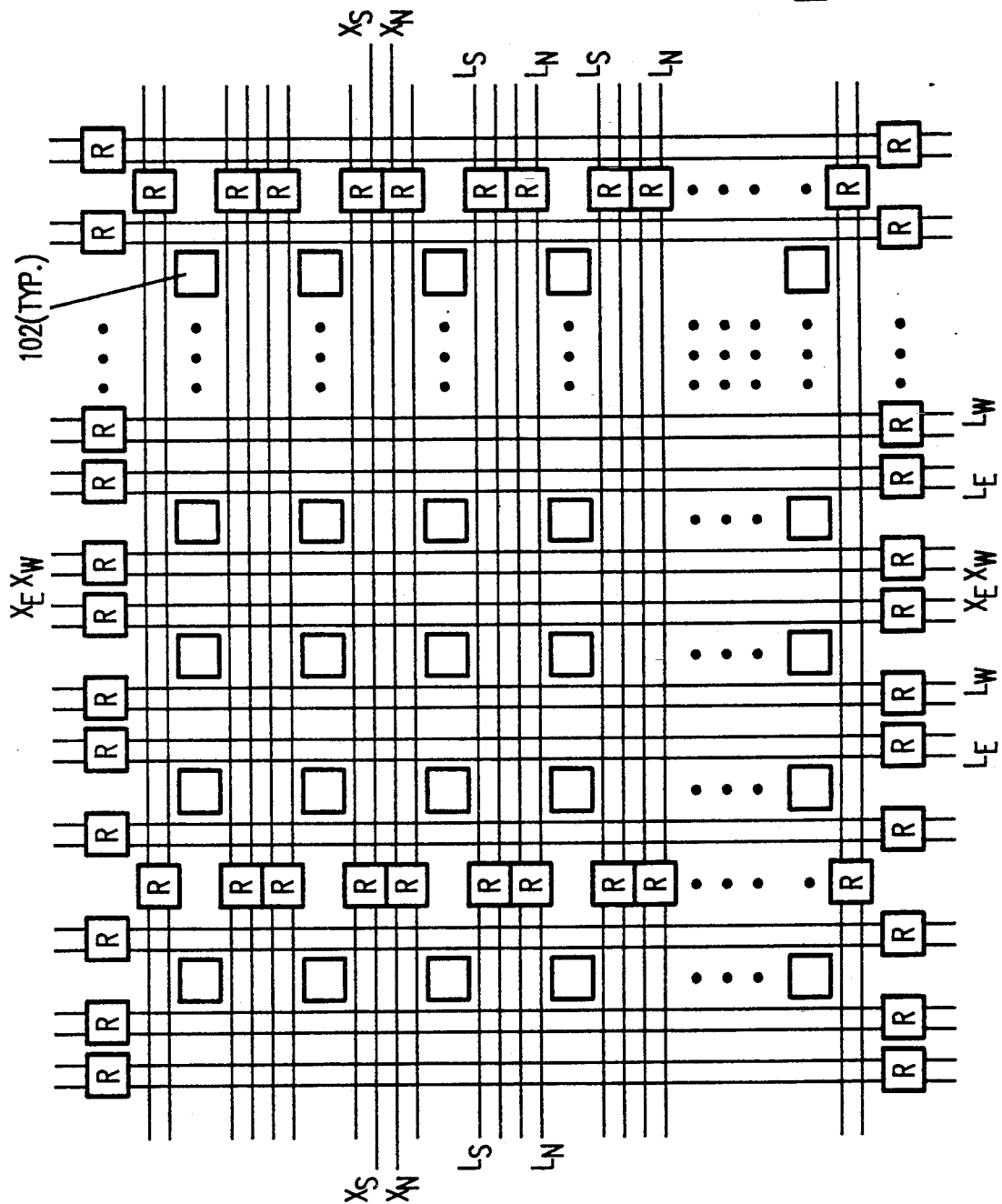
FIG. 23B is a schematic representation illustrating repeaters utilized in the FIG. 18 CLA array.

Repeaters R are used to regenerate bus signals and to drive the different bus segments at the superblock interface. A repeater R is shown in FIG. 23B. Under configuration control, the following paths in the repeater are possible:

| Description: | Path in FIG. 23B |
|---|---|
| Local Bus L1 drives Local Bus L2 | D1-PG3 |
| Local Bus L2 drives Local Bus L1 | D3-PG6 |
| Express Bus X1 drives Express Bus X2 | D2-PG5 |
| Express Bus X2 drives Express Bus X1 | D4-PG8 |
| L1 drives Local Bus L2 & Express Bus X2 | D1-PG3 & PG2 |
| L2 drives Local Bus L1 & Express Bus X1 | D3-PG6 & PG7 |
| X1 drives Express Buss X2 & Local Bus L2 | D2-PG5 & PG4 |
| X2 drives Express Buss X1 & Local Bus L1 | D4-PG8- & PG9 |
| Local Busses L1 & L2 are single bidirectional bus | PG1 |
| (This latter path can be used to make a long busses spanning multiple repeaters.) | |

Figure 24:
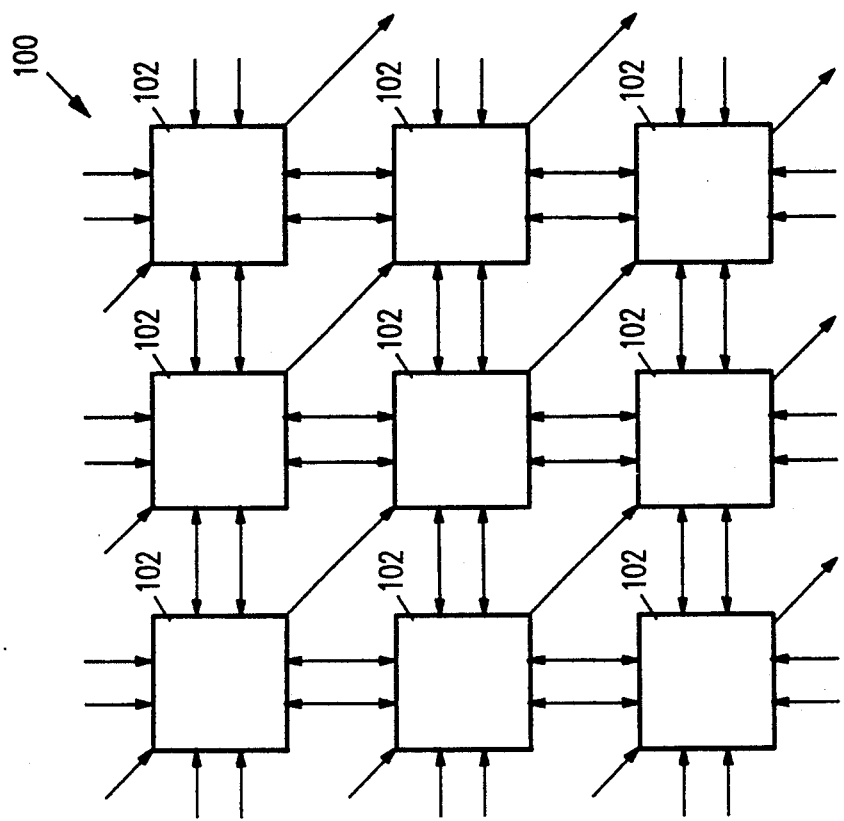
FIG. 24 is a schematic representation illustrating diagonal connections between abutting logic cells in the FIG. 18 CLA array.

Additionally, as shown in FIG. 24, the CLA array 100 can include diagonal interconnections between abutting cells 102 With diagonal cell interconnection, a substantially smaller number of cells 102 are used by certain macros for interconnections, thereby improving performance and gate array utilization and increasing the interconnect resources.

As shown in FIG. 24, data flows diagonally from left to right. Each cell 102 requires an additional input to the input mux and an additional output to the bottom right. The diagonal interconnect concept can be extended to data flowing diagonally from right to left (top to bottom), left to right (bottom to top) and right to left (bottom to top).

Figure 25:
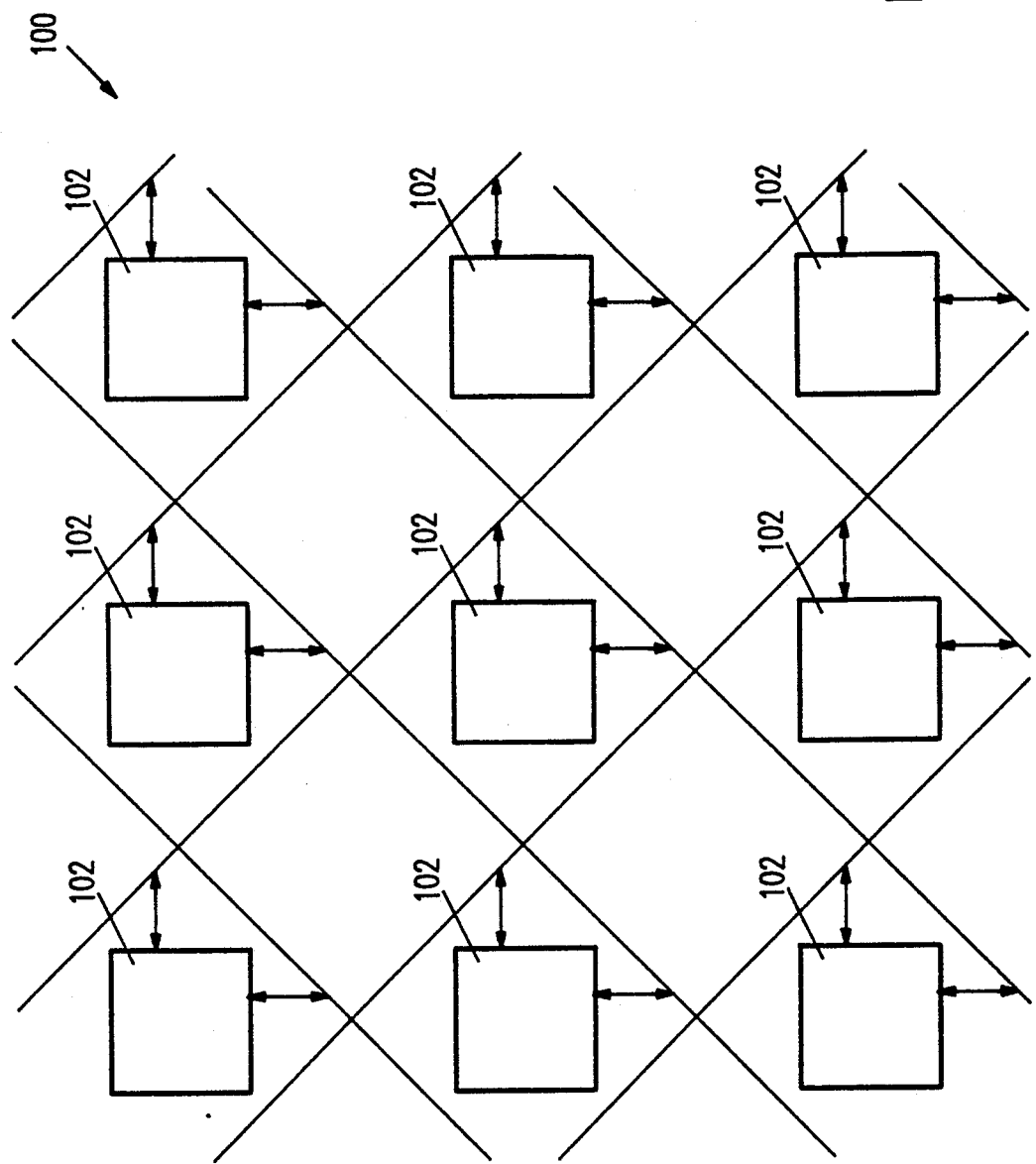
FIG. 25 is a schematic representation illustrating diagonal local busses in the FIG. 18 CLA array.

As shown in FIG. 25, the array 100 can include an additional set of local vertical buses and an additional set of local horizontal busses. However, instead of these busses being purely vertical and horizontal, as in the case of the local busses discussed above, this second set of local busses runs diagonally. Thus, as shown in FIG. 25, one set of these busses attaches to the cell's East side and one attaches to the cell's South side. In this architecture, every cell 102 is capable of driving each of the busses to which it is attached. In this arrangement, each cell 102 in the array 100 can connect more easily to nearby cells 102 in a diagonal direction, a very useful feature in compute-intensive algorithms and in random logic.

Each programmable function of the CLA 100 is controlled by one or more transistor pass gates, each of which has its pass-or-block state determined by the state of a memory bit, either directly or through a decoder. All of these registers are collectively referred to as SRAM Configuration Data Storage. The advantage of an SRAM (Static Random Access Memory), as opposed to a ROM (Read Only Memory), in this application, is that the configuration data can be changed a virtually unlimited number of times by simply rewriting the data in the SRAM.

Figure 26:
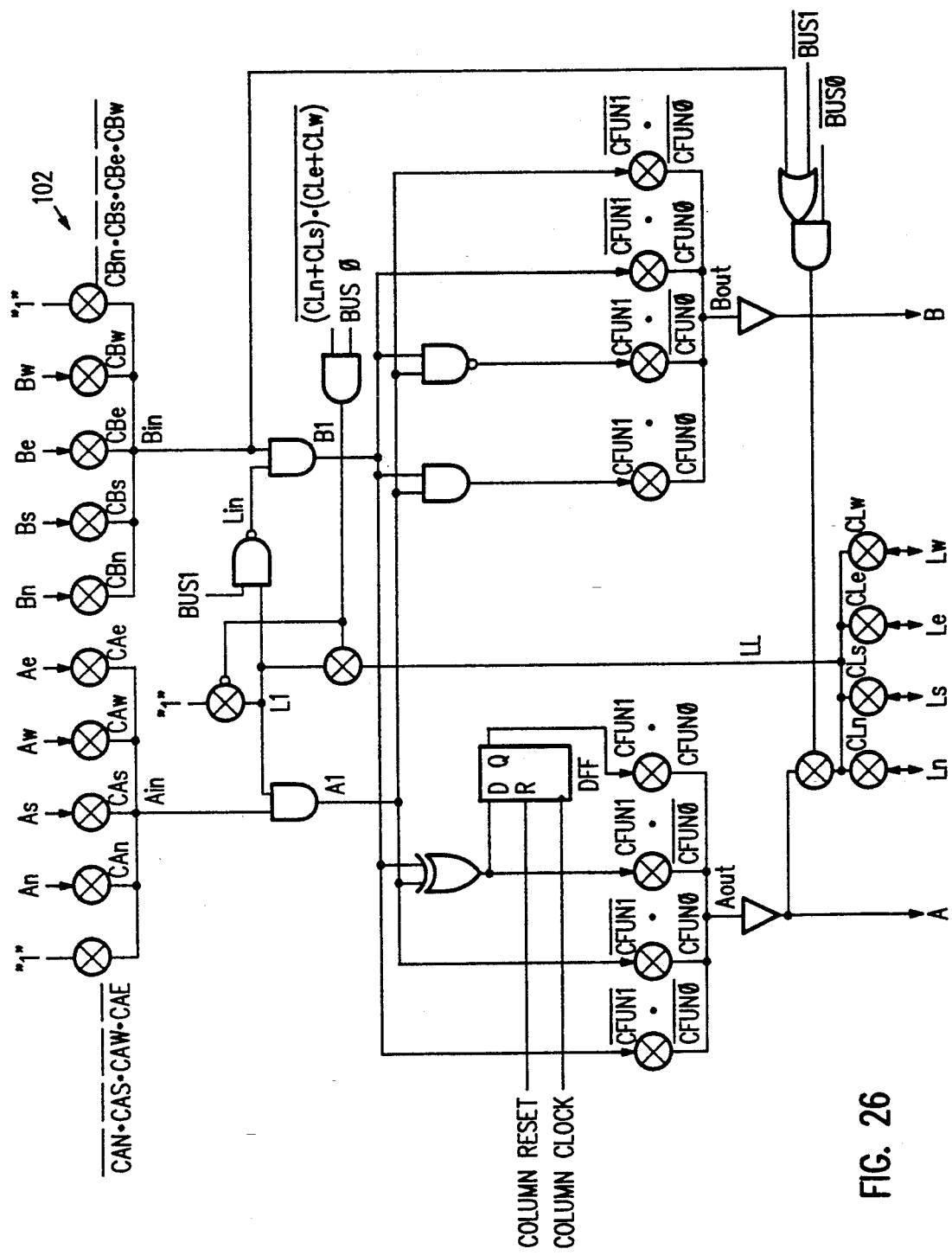
FIG. 26 is a functional diagram illustrating a logic cell utilizable in the FIG. 18 CLA array.

The functional diagram for an embodiment of the logic cell 102 is shown in FIG. 26. It consists of five 4:1 muxes, (shown in pass-gate form), cell function logic, and 4 high impedance local bus connectors (also shown in pass-gate form) drivers. Three of the 4:1 muxes determine the A, B, and L inputs to be used by the cell function logic. If no input to a mux is selected, then the output of the mux is forced to a logical "1" state. The cell function logic implements the function to be applied to the A, B and L inputs and supplies the result to the A and B output muxes. The four pass gates connecting the cell to the local busses allow the cell 102 to drive its corresponding local busses or receivers signals from the busses.

The application of the illustrated technology uses 16 bits of SRAM for each cell's configuration memory address space to define the functionality of the FIG. 26 logic cell 102. Fourteen bits are used for input and output multiplex control. The remaining two bits are used to determine the cell's use of its associated local busses. These two bits (BUS0, BUS1), combined with the number of local busses enabled for a given cell, determine the function of the local busses within the cell, as shown in Table I below. If BUS0 is a "1", then either 1 or 2 of the local busses must be selected. Otherwise, any number of local busses may be selected, within the dictates of Table I.

TABLE I

| BUS0 | BUS1 | L's en-abled | local bus function within cell | Li | TRI-STATE Control |
|---|---|---|---|---|---|
| 0 | 0 | 0 | not used | "1" | "0"(disabled) |
| 0 | 0 | 1-4 | output | "1" | "0"(enabled) |
| 0 | 1 | 0 | not used | "1" | "0" |
| 0 | 1 | 1-4 | output | "1" | Bin |
| 1 | 0 | 1 | input | enabled L | "0" |
| 1 | 0 | 2 | x/y turn | "1" | "0" |
| 1 | 1 | 1 | mux select | enabled L | "0" |
| 1 | 1 | 2 | x/y turn | "1" | "0" |

The function of the cell's control/configuration bits is described in Table II below.

TABLE II

| SIGNALS | # OF BITS | DESCRIPTION |
| --- | --- | --- |
| CAN, CAS CAE, CAW | 4 | A Input mux selects (zero or one enabled) |
| CBN, CBS CBE, CBW | 4 | B Input mux selects (zero or one enabled) |
| CLN, CLS CLE, CLW | 4 | L enables (any number, per Table I) |
| BUS0, BUS1 | 2 | Determines local bus function within cell |
| CFUN0, CFUN1 | 2 | A and B output function select |

Figure 27:
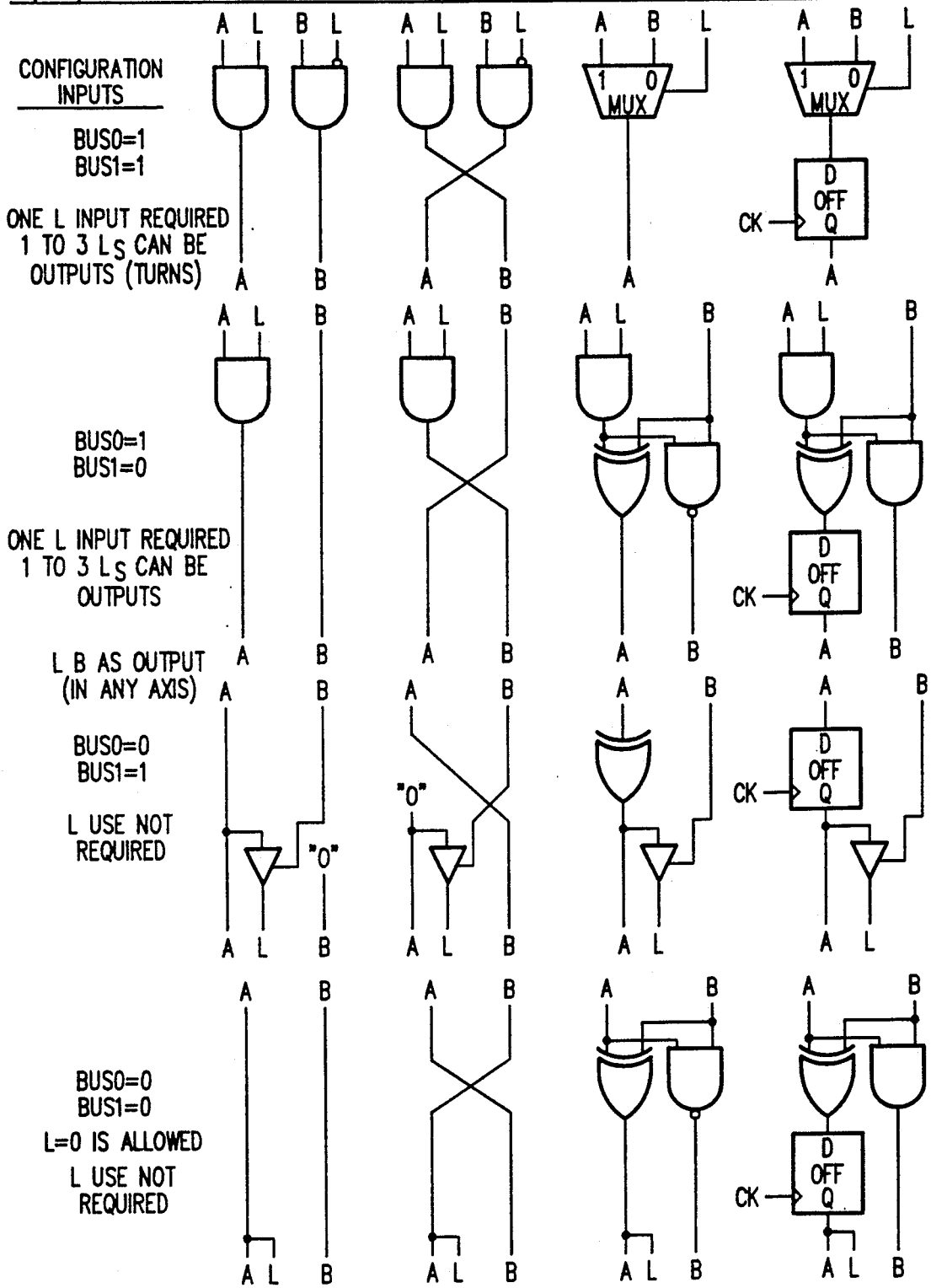
FIG. 27 shows sixteen basic configurations illustrating the FIG. 26 logic cell.

Thus, there are sixteen primary functional configurations of the CLA cell 102, based on the sixteen possible combinations at signals CFUN1, CFUN2, BUS0 and BUS1. FIG. 27 shows the functional diagrams of these sixteen configurations.

Other applications of this technology may use more (or less) than 16 SRAM configuration bits per cell, e.g. to switch the connections of additional busses.

Figure 28:
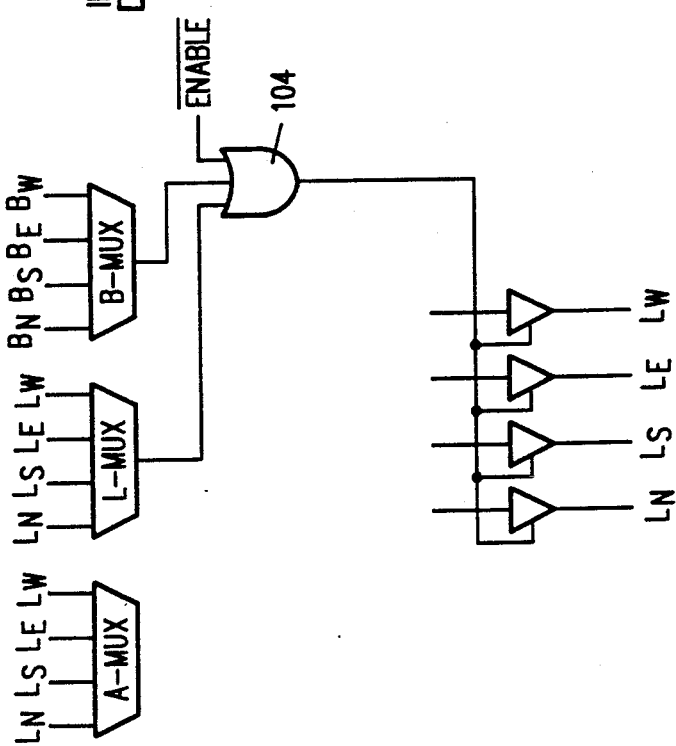
FIG. 28 is a schematic representation of a possible modification to the FIG. 26 logic cell.

FIG. 28 shows a possible modification to the FIG. 26 logic cell 102 that allows the high impedance control signal to be input over the local bus through the L mux. Additionally, both the local bus input and the B input of the cell can be used for control of the high impedance state. This allows the user the flexibility of using either of the inputs for high impedance state control, thereby saving cells used for wiring. As shown in FIG. 28, the high impedance control signal is provided by the output of OR gate 104. The L-mux and B-mux outputs, with the high impedance enable signal, are inputs to the OR gate 104. This facilitates using either the local bus inputs (through the L-mux) or the B inputs (through the B-mux) as the high impedance control signal.

Figure 29:
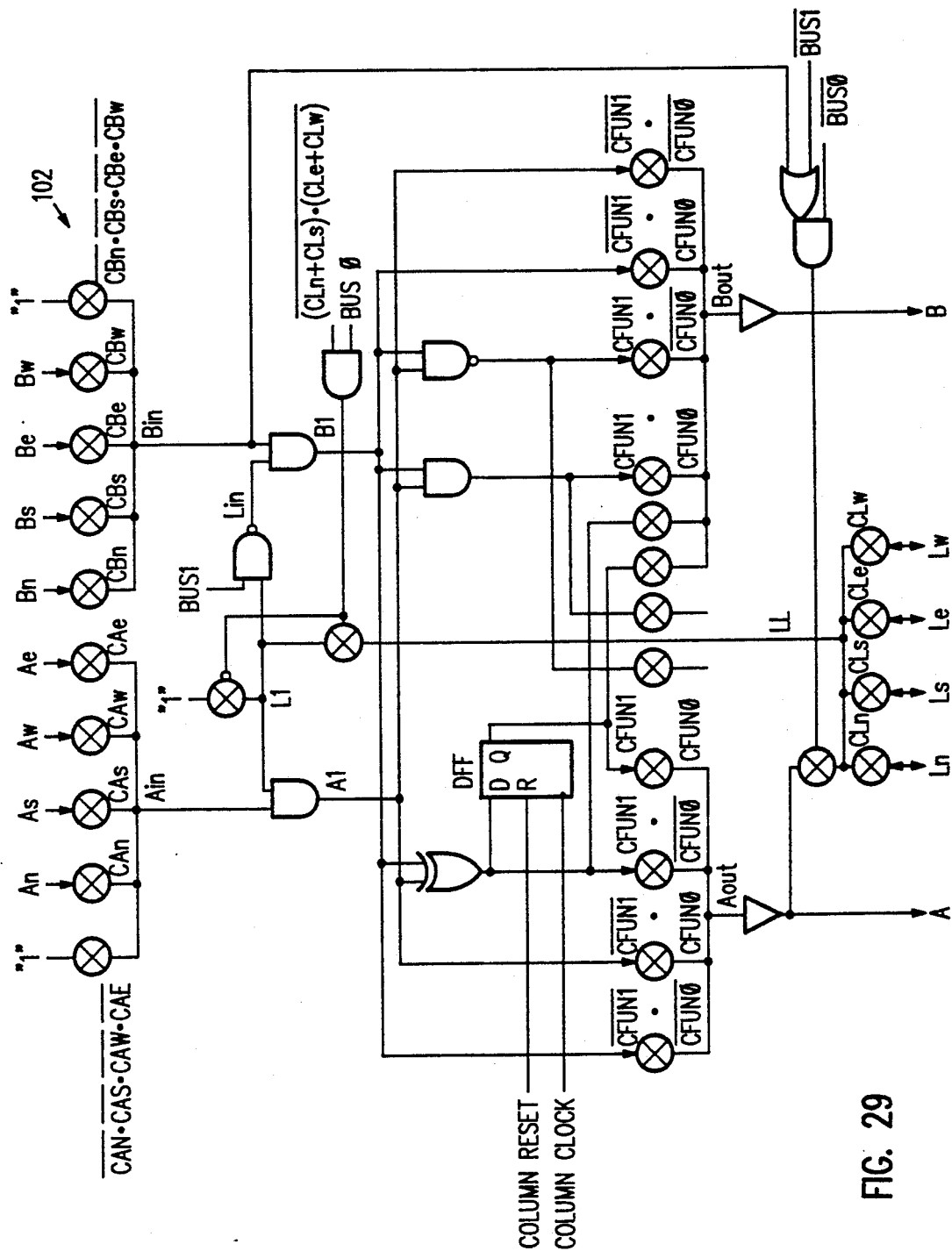
FIG. 29 is a logic diagram illustrating an alternate embodiment of a logic cell utilizable in the FIG. 18 CLA array.

FIG. 29 shows an alternative embodiment of logic cell 102. The alternate cell utilizes six-state output muxes, giving the user the flexibility of obtaining the outputs of the XOR, Flip-Flop, NAND and AND functions on either the A output or B output of the cell. Therefore, the user does not have to use an extra cell as a cross-wire for routing to switch the A output to the B output and vice versa.

The alternate cell shown in FIG. 29 requires one extra configuration bit to provide the extra control required for both the A output mux and the B output mux. This extra bit is accommodated by decoding the control signals for all of the input muxes, as shown in FIG. 29. If cell space is a limitation, then only one input mux must be changed to decoded control (3 lines) signals, with the other two input muxes using undecoded control signals (4 lines).

Figure 30:
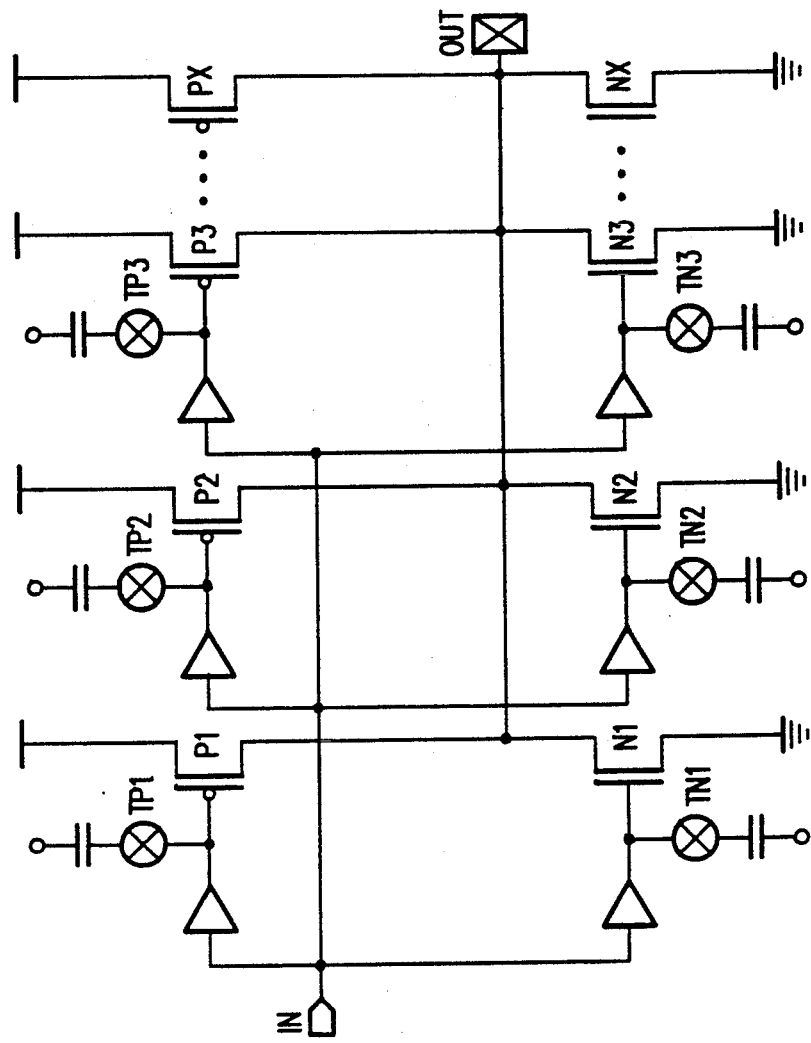
FIG. 30 is a logic diagram illustrating a tri-statable output buffer circuit utilizable in the FIG. 18 CLA array.

FIG. 30 shows an embodiment of a high-performance, high impedance output buffer circuit 106, with reduced groundbounce, that is utilizable in conjunction with the CLA array 100. The output buffer circuit 106 compensates output buffer slew-rate for process and temperature variation to reduce groundbounce with minimal performance impact.

The output buffer 106 is designed to reduce groundbounce by staging the turn on of the upper transistors (P1, P2, P3, ...Px) and lower output transistors (N1, N2, N3, ...Nx).

The delays between stages are created by transmission gates (TP1, TP2, TP3, TN1, TN2, TN3) in series with capacitors connected at the gates of the output transistors. These transmission gates tend to compensate the output buffer's slew rate for variations in processing and temperature. Under conditions that would normally cause the output transistors to have highest current carrying capability and, thus, fastest slew rate and greatest groundbounce, the transmission gates will have lowest impedance and thus allow the capacitors to which they are connected to have maximum effect. Under conditions that would normally cause the output transistors to have lowest current-carrying capability and, thus, slowest slew rate, the transmission gates will have highest impedance and thus tend to isolate their corresponding output transistors from the capacitors to which they are connected. The benefit of this is that, for a given level of groundbounce under fast conditions, the maximum delay of the output buffer under slow conditions can be less than that possible using conventional, non-compensating techniques.

Figure 32:
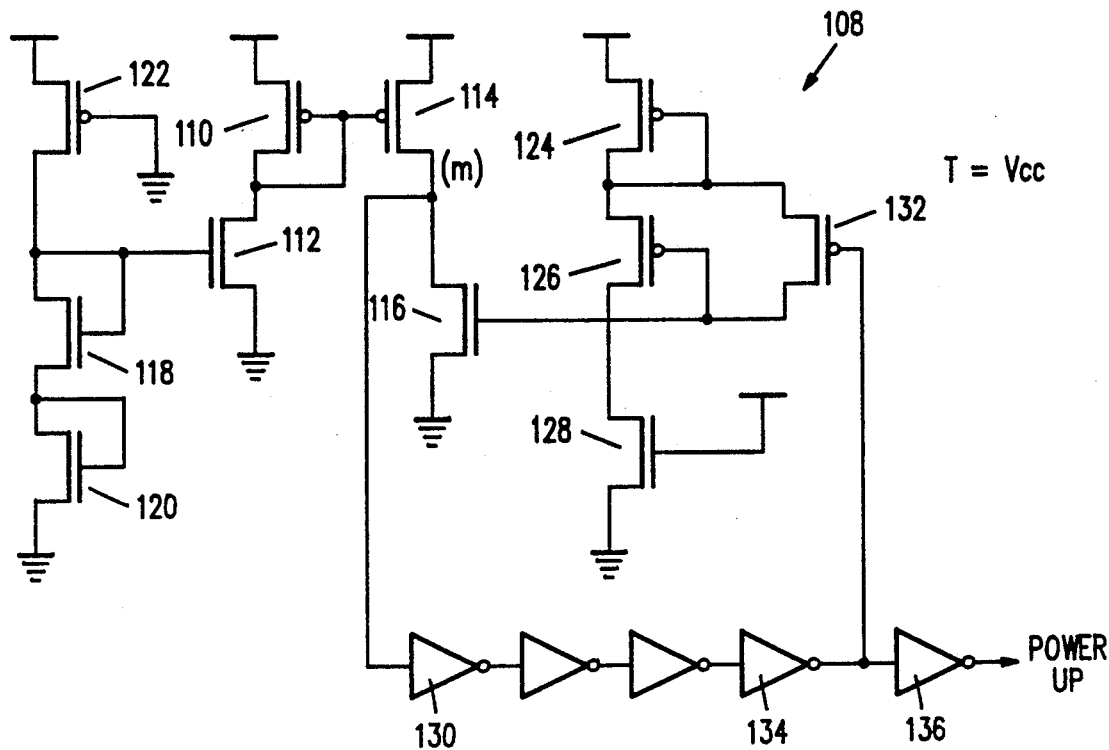
FIG. 32 is a schematic diagram illustrating a power up sensing circuit utilizable in the FIG. 18 CLA array.

FIG. 32 shows an embodiment of a power-up sensing circuit 108 utilizable with the CLA array 100. The purpose of circuit 108 is to create a reset signal for the internal logic of the CLA array 100 when the power supply ramps, independent of the ramp rate.

Figure 33:
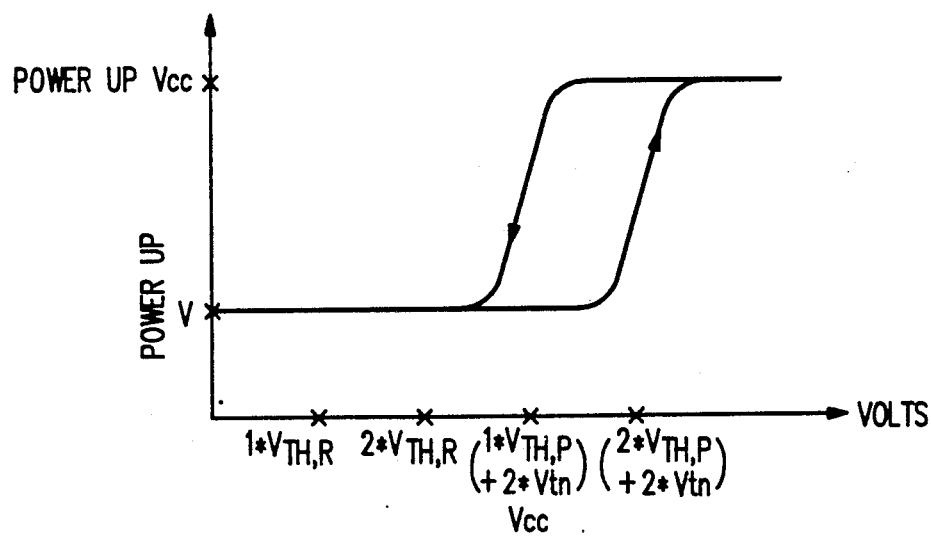
FIG. 33 is a graph illustrating the hysteresis of the FIG. 32 power up sensing circuit.

The power-up circuit 108 detects power applied to the CLA device by monitoring the VCC signal. After VCC reaches the level of two n-channel Vts, the PWRERRN signal goes low and stays low until VCC reaches the level of two n-channel and two p-channel Vts. The PWRERRN signal can thus be used as a reset signal for the CLA device to ensure that the device is in a known state after power up. When the PWRERRN signal goes high, the VCC level necessary to keep PWRERRN high changes to 2 n-channel and 1 p-channel Vts. This hysteresis quality, illustrated in FIG. 33, means that power supply spikes down to 2 n-channel and 1 p-channel Vt can be tolerated without resetting the chip.

Referring to FIG. 32, the power-up sensing circuit 108 works as follows. N-channel transistors 110, 112, 114 and 116 make up a comparator, with the gates of transistors 112 and 116 being the comparator inputs. N-channel transistors 118 and 120 have very large gate widths, while P-channel transistor 122 is very small. This will result in the gate of transistor 112 being clamped at (2*Vth,n) above ground for Vcc >(2*Vtn,n). Both P-channel transistor 124 and P-channel transistor 126 are very large and N-channel transistor 128 transistor is very small. This would make the input to the transistor 116 gate (2*Vth,p) less than Vcc, for Vcc>(2*Vtn,P). As Vcc ramps up, while the Vcc to GND voltage is less than (2*Vth,p+2*Vth,n) the transistor 112 gate will be at a higher potential than the transistor 116 gate. This will result in the comparator output (m) providing a logic "1" level to the input of inverter 130 input causing the power up signal to be at a logic "0" level. Once the Vcc to GND potential exceeds (2*Vth,n+2*Vth,p) the transistor 112 gate will be lower than the transistor 116 gate. This will cause the (m) node to be at a logic "0" level, and the power up output to be at a logic "1" level. This indicates that the power is at a sufficient level to support proper device operation. Hysteresis is provided by P-channel transistor 132. When the gate of transistor 132 is high, transistor 132 is disabled, and the circuit operates as described above. After node (m) goes low, the gate of transistor 132 will be pulled to ground by inverter 134. Thus, transistor 132 will effectively short the source of transistor 126 to its drain, thereby lowering the Vcc to GND voltage needed to cause node (m) to be at a logic "1" level to (2*Vtn,P). Therefore, the Vcc to GND differential will have to fall to (1*Vth,p) plus (2*Vth,n) before the power up signal provided by inverter 136 will go low.

In accordance with another aspect of the CLA device 100 architecture, I/O cell pins are provided that are connected directly to the array's express busses in addition to the edge core cells.

As stated above, the architecture of the CLA device 100 comprises a regular array of logic cells 102. I/0 pins in I/O cells are attached uniformly around the periphery of the array. An I/O cell is connected to two adjacent edge core cells 102 of the array.

Figure 34:
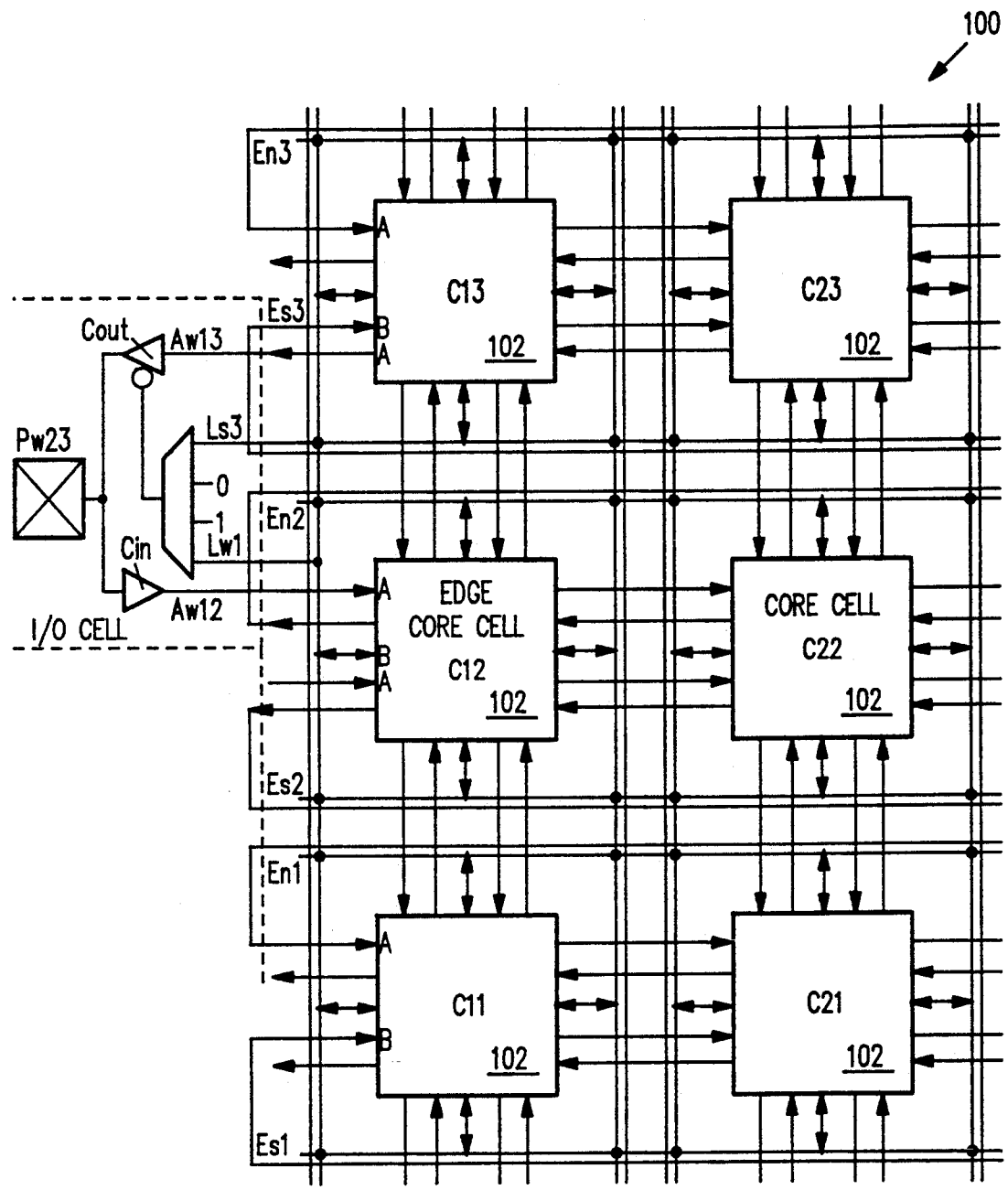
FIG. 34 is a block diagram illustrating edge core cells and I/O cells in the FIG. 18 CLA array.

FIG. 34 shows an example of pin Pw23 in an I/O cell connected to two core cells 102 on the west edge of the array 100. The input buffer Cin of the Pw23 I/O cell is connected to an A input of an edge core cell via wire Aw12. The output buffer Cout is connected to an A output of an adjacent edge core cell via wire Aw13. Placing of the output buffer Cout in the high impedance state can be controlled by configuration (always enabled or disabled) or by signals on a horizontal or vertical buss, Ls3 or Lw1 respectively.

Express busses running horizontally and vertically are connected to A or B inputs and outputs of edge core cells (e.g. express busses Es1, En1, Es2, En2, Es3 and En3 in FIG. 34).

Figure 35:
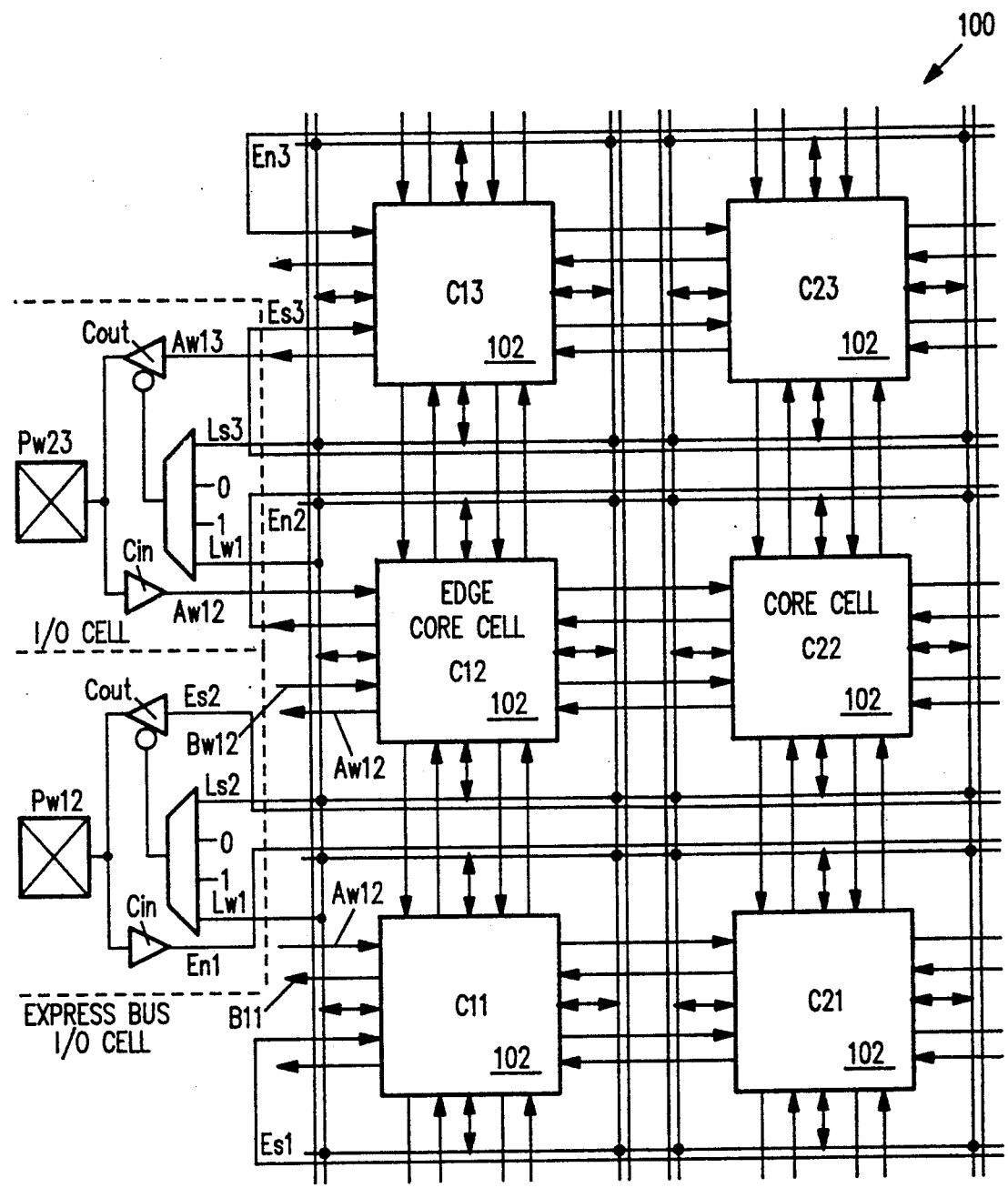
FIG. 35 is a block diagram illustrating express bus I/O cells in the FIG. 18 CLA array.

In a modified architecture, a new type of I/O cell is added. These new express bus I/O cells connect directly to the express busses instead of being connected to a core cell. FIG. 35 shows an example of an express bus I/O cell Pw12 adjacent to I/O cell Pw23.

The express bus I/O cells make only minor modifications in the architecture of the CLA device 100. As in the regular I/O cells, high impedance is controlled at configuration or by the horizontal and vertical local busses Lw1 and Ls2, respectively. Unlike the regular I/O cell, however, input buffer Cin and output buffer Cout are connected directly to express busses En1 and Es2, respectively, and the express bus links that previously went to the core cells are disconnected from the express busses; for example, express bus Es2 is not connected to A output A12 and express bus En1 is not connected to A input Aw11.

The addition of the express bus I/O cells allows direct access to express busses, thus improving access to interior regions of the array 100 and improving its cross-point switch capabilities.

Figure 36:
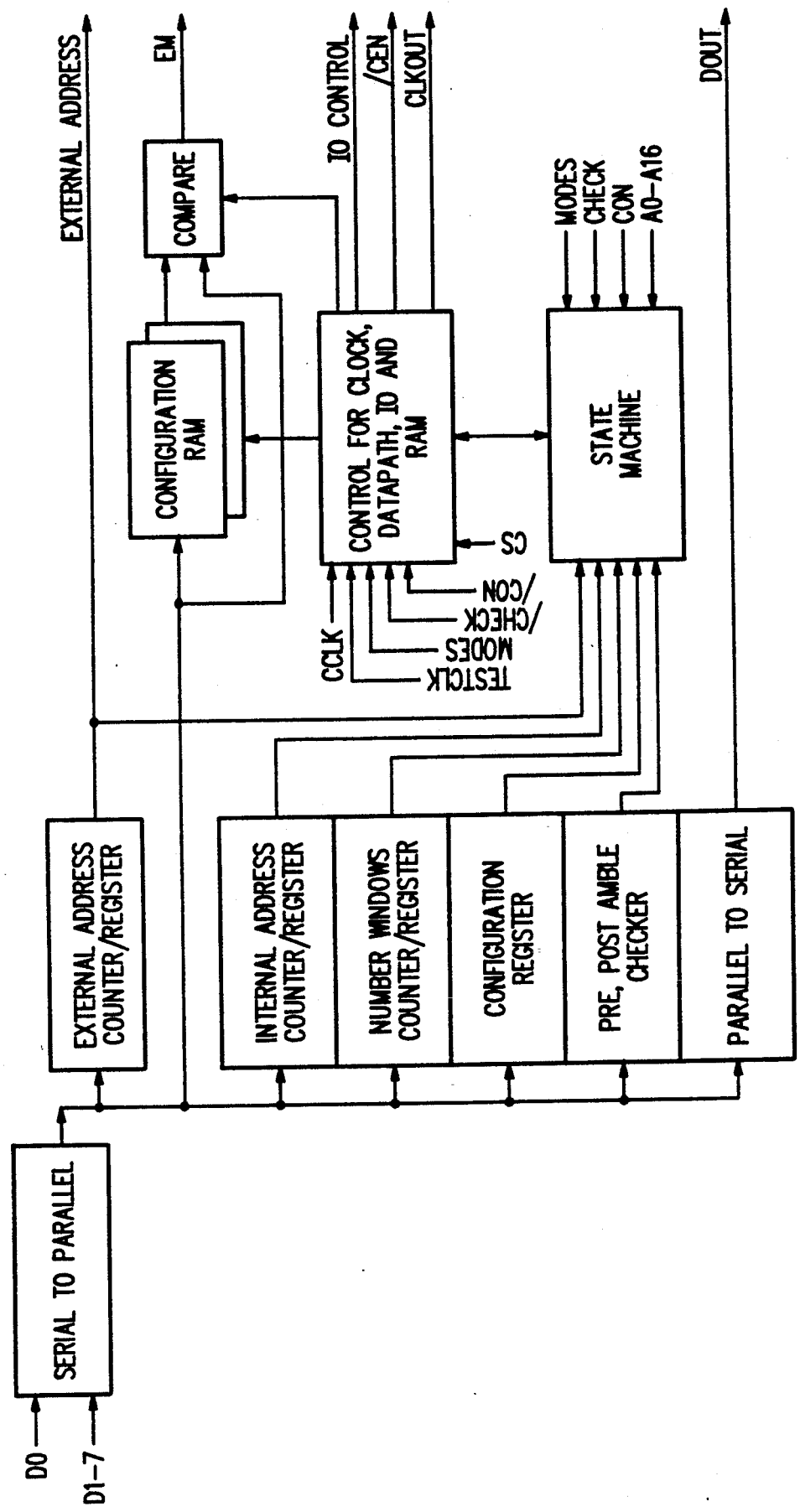
FIG. 36 is a block diagram illustrating configuration logic for the FIG. 18 CLA array.
Figure 37:
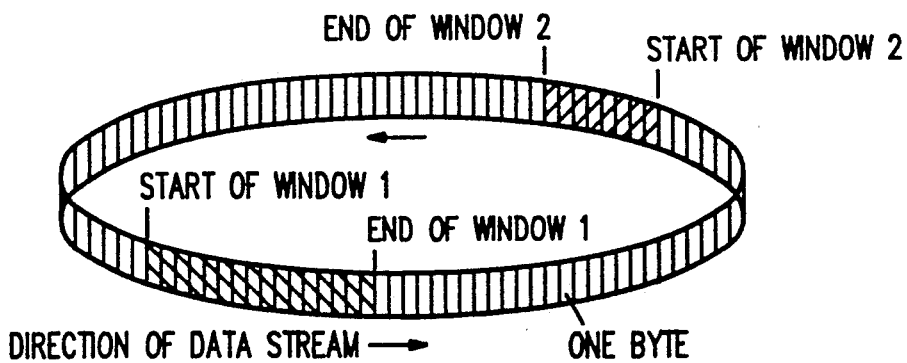
FIG. 37 is a schematic representation illustrating the loading of a configuration file into the internal configuration SRAM within the FIG. 18 CLA array.

FIG. 36 shows a block diagram of the configuration logic for the CLA array 100.

The device pins required for configuration of the CLA array 100 are as follows:

The dedicated pins are:

/Con Configuration Request Pin (Open collector I/O). This pin is pulled low along with/Cs by the user to initiate configuration. Once the device has begun configuration, it will drive /Con low until configuration is complete. The device will also pull /Con low during the power-up and reset sequences. The chip will auto-configure in modes 4 and 5 (as shown in Table III).

/Cs Chip Select (Input). Must be pulled low with /Con to initiate configuration or reset.

Cclk Configuration Clock (Input/output). This signal is the byte clock in Address modes, and the bit clock in bit-sequential modes. In the byte-sequential mode, this pin is used as an active low write strobe. In direct-Address mode, this is an active low data strobe. Cclk is not used during configuration reset. The device drives Cclk during configuration in modes 4 and 5 with a frequency between 1 and 1.5 MHz. In all other modes, Cclk is an input, with a maximum frequency of 16 MHz. Note that cascaded programming will not work in byte-sequential or Address modes with as Cclk of over 1 MHz.

The Mode pins M2, M1, M0 (input) are used to select the configuration mode, as described in Table III.

TABLE III

| M2 | M1 | M0 | Description of Modes |
|----|----|----|----------------------|
| 0 | 0 | 0 | Configuration Reset |
| 0 | 0 | 1 | Address, Count up, external CCLK |
| 0 | 1 | 0 | Address, Count down, external CCLK |
| 0 | 1 | 1 | Bit-Sequential, external CCLK |
| 1 | 0 | 0 | Bit-Sequential, internal CCLK |
| 1 | 0 | 1 | Address, Count up, internal CCLK |
| 1 | 1 | 0 | Byte-Sequential, external CCLK as write strobe |
| 1 | 1 | 1 | Direct Addressing, external CCLK as data strobe |

The dual-purpose pins are:

| | |
|---|---|
| D0 | Data pin (Input/Output). This pin is used as serial data input pin, and as the LSB in byte-sequential, direct addressing and Address modes. Used as an I/O only in direct address mode. |
| D1-7 | Data pins (Input/Output). These pins are used as data input pins in byte-sequential and Address modes and as I/O only in direct address mode. |
| A0-16 | Address pins (Input/Output). 17 bits of address are used as outputs during Address modes for accessing external memory. 13 bits are also used as internal address inputs for the configuration RAM in direct address mode. |
| /Cen | Chip enable (Output). This signal is driven low by the device during configuration in byte-sequential and Address modes. It can be disabled by setting configuration register bit B2. It is used for the Output Enable (OE) and Chip Enable (CE) of parallel EPROMs. |
| /Check | Enables Check configuration (Input). This pin enables checking of the configuration RAM against data on input pins. If this pin is enabled, then writing configuration data is disabled. This pin is disabled during the first configuration after power-up or reset, and whenever configuration register bit B3 is set. In direct address mode, this pin selects whether data is being written to or read from the configuration RAM. |
| /Err | Error (Output). This output is driven low if there is a configuration error, a configuration RAM addressing error, or an incorrect preamble or postamble at the end of a block of configuration data. It also signals the result of the configuration check, selected when /Check is low. This output is disabled when configuration register bit B3 is set. |
| Dout | Data out (Output). This pin provides the data output to another CLA device during cascaded programming. It can be disabled by setting configuration register bit B2. |
| Clkout | Clock out (Output). This pin provides the clock output to another CLAY during cascaded programming. It can be disabled by setting configuration register bit B2. |
| Testclk | Test clock (Input). This pin overrides the internal oscillator after a certain reserved configuration bit is set to logical "1". This feature is used for internal testing purposes. |

The CLA array 100 can be in either an operational state or in a configuration state. After initial configuration, the device moves into the operational state. It can be pulled back into the configuration state by assertion of the "/Con" and "/Cs" inputs.

The configuration file, in a cascaded programming environment, is shown in Table IV below. The first CLA device in the cascade receives the Preamble. This is followed by the contents of the configuration register, an optional external memory address, and the number of windows in the first CLA device that need to be programmed. The start/stop addresses for each window and the configuration data follow. The configuration data (including header) for the cascaded devices are appended to the file. If the configuration register specifies that the device needs to load an external memory address, then this address is loaded every time it encounters that field. When the master has finished configuring itself, it looks for a preamble or postamble. If it finds a postamble, then configuration is complete. If it receives a preamble, then it passes on the data and clock to configure the next CLA device in the cascade.

TABLE IV

| | |
|---|---|
| Preamble | (1 byte) |
| Config reg contents for first device | (1 byte) |
| External Memory Address | (3 bytes) |
| Number of windows to be programmed | (1 byte) |
| Reserved Byte | (1 byte) |
| Start address of window number 1 | (2 bytes) |
| End address of window number 1 | (2 bytes) |
| Bytes of data for window number 1 | (1 byte each) |
| Start address of window number n | (2 bytes) |
| End address of window number n | (2 bytes) |
| Bytes of data for window number n | (1 byte each) |
| Preamble | (1 byte) |
| Config reg contents for cascaded device | (1 byte) |
| External Memory Address (for first device) | (3 bytes) |
| Reserved Byte | (1 byte) |
| Number of windows to be programmed | (1 byte) |
| Postamble | (1 byte) |

The first CLA device loads itself until it exhausts the number of windows it has to configure. Any data after this and within the configuration file is used for cascaded devices. At the end of configuration, the external memory address counter in the first device is either reset or stored at the current value depending on the state of bit 0 in the configuration register. The preamble is "10110010" and the postamble is "01001101". Serial data is transmitted LSB first.

The clock description for each mode is shown in Table V below.

TABLE V

| M2 | M1 | M0 | Clkout | CSM | CCLK |
|---|---|---|---|---|---|
| 0 | 0 | 0 | NA | NA | NA |
| 0 | 0 | 1 | osc | cclk | input |
| 0 | 1 | 1 | cclk | cclk | input |
| 1 | 0 | 0 | cclk | cclk | osc/8 |
| 1 | 0 | 1 | osc | cclk | osc/8 |
| 1 | 1 | 0 | osc | /wr | /wr |
| 1 | 1 | 1 | NA | NA | /DS |

Osc is the internal oscillator which runs between 8 and 12 MHz.

/WR is the Cclk input used as a write strobe.

/DS is the Cclk input used as a data strobe.

In modes 1, 2, and 6, data is output on the Dout pin along with the clock on the clkout pin. The configuration scheme allows the user to provide a Cclk at up to 16 MHz for these modes. However, for cascaded programming and other applications where Clkout and Dout are required, the speed of Cclk must be less than 1 MHz in these modes.

To specify the desired application function, the user must load the internal SRAM which the CLA device uses to store configuration information. The user does not need to generate the SRAM bit pattern; this is done for the user by the Configurable Logic Array Software System.

The user must also determine the method by which the configuration RAM is loaded. Many factors, including board area, configuration speed, and the number of designs concurrently implemented in a device can influence the user's final choice.

The CLA provides seven configuration modes:
Mode 0: Configuration Reset
Mode 1: Address Count-up, External CCLK
Mode 2: Address Count-down, External CCLK
Mode 3: Bit-sequential, External CCLK
Mode 4: Bit-sequential, Internal CCLK
Mode 5: Address Count-up, Internal CCLK
Mode 6: Byte-sequential, External CCLK
Mode 7: Direct Addressing, External CCLK Upon power-up, the CLA goes through a boot or initialization sequence. This sequence initializes all core cells, repeaters, I/O logic, clock distribution logic, and open collector controls, as well as the configuration register and external memory address counter (discussed below).

Core cells become flip-flops with $A_N$ and $B_N$ inputs.
All bus drivers are switched off.
All repeaters are open and all bus segments are high impedance.
I/Os are set as TTL inputs only, with the pull-up on.
All open collector controls are set for full CMOS drive.
Each of the bits in the configuration register is reset.

During the initialization sequence, the CLA device 100 drives the /CON pin low. Since power-up initialization uses an internal clock for timing, no external clock source is required. Once initialization is complete, /CON, which is an open collector output, is released; it must be pulled high by an external pull-up resistor.

After power-up initialization is complete, the CLA device 100 is ready to accept the user's configuration. After /CON has been released for a minimum period of time, the user can initiate the configuration cycle by driving /CS and /CON low (in some modes this can take place automatically). The configuration mode is determined by the values on the M0, M1, and M2 pins, as described above. Once the first bytes of the configuration have been loaded, the CLA device 100 takes over driving /CON low, the values on the M0, M1, and M2 pins are ignored, and CS can be released high. The CLA device will release /CON only after the complete configuration file has been read. It will remain in the configuration state until both /CON and /CS are released.

The CCLK pin should be driven with the configuration clock (in External CCLK Modes) and the M0, M1, and M2 pins held constant throughout the reboot and configuration sequences.

The user can reconfigure the CLA device 100 at any time by asserting /CON and /CS, as outlined above. The CLA device must be allowed to move into the operational state (/CON and /CS high) between configurations. Note that those pins not required for configuration remain operational throughout a configuration sequence allowing partial reconfiguration of an operational device.

Details of each configuration mode are described below.

Figure 38:
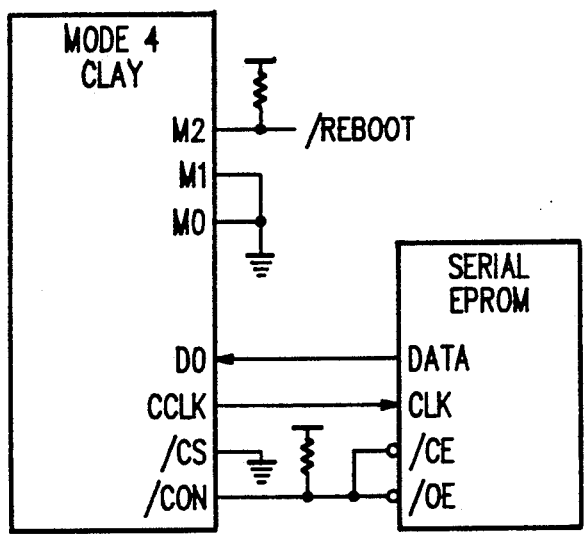
FIG. 38 is a schematic representation illustrating the bit sequential, internal clock configuration mode of the FIG. 18 CLA array.

The configuration file which is stored in an external memory device is used to load the user's configuration into the internal configuration SRAM within the CLA, as shown in FIG. 38. This file has a similar format, shown in Table VI, regardless of the configuration mode (sequential, or Address).

TABLE VI

| Configuration File Formats | |
|---|---|
| Single CLA | Cascaded CLAs |
| Preamble | Preamble |
| Header | Header |
| [Window 1] | [Window 1] |
| [Window 2] | [Window 2] |
| [Window 3] | [Window 3] |
| [Window n] | [Window n] |
| Postamble | Preamble |
| | Header 2 |
| | [Window 1] |
| | [Window 2] |
| | [Window 3] |
| | [Window n] |
| | Preamble |
| | Preamble |
| | Header n |
| | [Window 1] |
| | [Window 2] |
| | [Window 3] |
| | [Window n] |
| | Postamble |

The preamble is a fixed data byte used to synchronize the serial bit stream in sequential modes, and to signal the start of the configuration file in all modes.

The header is a five byte field which includes configuration register data, the external memory address for Address modes, and a counter for the number of CLA data windows to be programmed.

The configuration register includes five bits used to control various configuration sequence parameters. Information regarding these five bits follows.

| | |
|---|---|
| | [X\|X\|X\| B4 \| B3 \| B2 \| B1 \| B0 ] |
| B0 | This bit determines whether the external memory address in Address modes is reset after each configuration sequence (default), or if it retains its last value. This allows the user to store multiple designs as sequential configuration files. Otherwise, the subsequent configuration sequences will load the configuration file from the same initial address (00000 in modes 1 and 5, 1FFFF in mode 2). |
| B1 | This bit determines whether the external memory address in the header field(s) will be ignored (default) or loaded into the CLA's external memory address counter. This allows the user to store configuration files as a continuous stream or as a pointer-based linked list. |
| B2 | This bit disables the /CEN, DATAOUT, and CLKOUT functions of these multiplexed configuration pins. This is useful if a minimum pin count configuration circuit is desired. |
| B3 | This bit disables the /ERR and /CHECK pins. This is useful both for design security and minimum pin-count configurations. |

-continued

| | |
|---|---|
| | [X\|X\|X\| B4 \| B3 \| B2 \| B1 \| B0 ] |
| B4 | This bit prevents configuration data from being written into the CLA during subsequent configuration sequences. The only way to reset this bit is by rebooting the device. |

The external memory address is used to set the external memory address counter of the CLA device 100 in the Address modes. This counter increments on every configuration clock in order to drive the address of an external memory device to generate a parallel data stream. The counter counts up in Modes 1 and 5, and down in Mode 2. The new programmed value will be output after each header has been read, according to the configuration bit settings. Note that the external address is for use by external memory. It has no relationship with the internal configuration SRAM within the CLA device 100. Configuration data is read into the CLA device 100 in a stream format.

Another header byte loads the number of windows counter. Configuration data windows make it possible to configure or reconfigure one or more sub-sections of the device. It is possible to load the entire CLA array using a single window. Multiple windows allow the user to jump over sections of the CLA array, thus saving configuration time and memory for lightly used arrays.

Data windows also support the creation of dynamic CLA designs, as small sections of the array can be reconfigured regularly as part of the design's functionality. The optimum set of configuration data windows are generated automatically by the CLA's development system. Only the section of the array selected by the user for reconfiguration will be programmed. There can be a maximum of 255 windows per CLA device 100. If 0 windows are specified, then the array's configuration will not be modified. This is useful if multiple CLA device are being configured simultaneously.

Each configuration data window consists of an internal array start address, an internal array end address, and the sequential data required to fill the segment of the array defined by the two addresses. Internally, the array is represented as a circular address space. The configuration data stream sequence is divided such that cell types are grouped together in the following order:

Core Cell Configuration Data
Bus Repeater Cell Data
I/O and Clock Cell Data
Open Collector Control Data If a single CLA device 100 is being configured, then the configuration data windows are followed by a postamble. This is a fixed data byte which signals the end of the configuration file. If multiple CLA devices 100 are being cascaded, however, another preamble byte will appear at this point in the configuration file. This preamble will be followed by another header and a new set of configuration data windows. Theoretically, any number of CLA devices 100 can be programmed in this fashion. In actual practice, however, it is recommended that not more than 8 CLA devices 100 be linked in this cascaded fashion, due to potential clock skew problems.

Configuration reset is not a true configuration mode. It is used to start the boot sequence. Enabling this mode is equivalent to turning power to the device off and on again, except that the state of the core's user-accessible flip-flops is saved. This mode is enabled by asserting /CS, /CON, M0, M1, and M2 low for a minimum period of time and then returning them to the desired mode. Once the reboot process is started, it overrides any other configuration sequence that may be running and cannot be stopped.

The remaining configuration modes load all or some of the CLA device's internal configuration SRAM.

Bit-sequential, internal CCLK mode 4 is the simplest of configuration modes, as it requires the fewest pins and the fewest external components. For a single CLA device, only one dual-function pin, DO, is needed for data received from a serial EPROM. The other dual-function pins, /CEN, /ERR, /CHECK, DATAOUT, and CLKOUT, are all optional. Assuming the CS and mode pins (M0, M1 and M2) are fixed, the only active pins are /CON, CCLK, and DO. Because most serial EPROMs come in 8-pin DIP packages, little board space is required for this configuration mode, as shown in FIG. 38.

During the power-up boot sequence, /CON is asserted low by the CLA device. Once initialization is complete, /CON is released long enough to reset a serial EPROM. If the mode pins are set to mode 4 before release of /CON, the CLA will then begin auto-configuration. It reasserts /CON low and an internal oscillator toggles CCLK. This causes the serial EPROM to generate a stream of data which configures the CLA device 100. One bit of configuration data is loaded from the DO pin on each rising edge of CCLK until configuration is complete. The CLA device 100 will then release /CON indicating that the device 100 is ready for use.

Configuration time will vary depending on the speed of the internal oscillator, but the maximum configuration time for a complete array is about 80 milliseconds.

Figure 39:
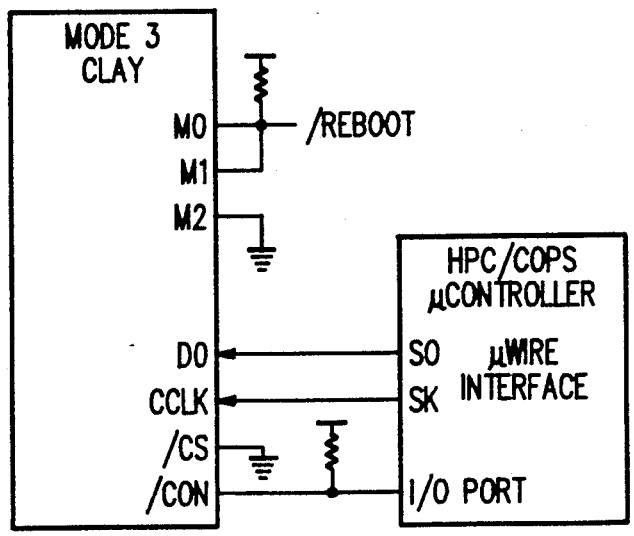
FIG. 39 is a schematic representation illustrating the bit sequential, external clock configuration mode of the FIG. 18 CLA array.

Bit-sequential, External CCLK (Mode 3) is very much like Mode 4, above, with two exceptions: the user must supply a configuration clock to the CCLK pin and the user most drive /CON low to start configuration. Mode 3 will not automatically generate a /CON signal after the power-up boot sequence. During configuration, only one dual-function pin, DO, is required. The pins /CEN, /ERR, CHECK, DATAOUT, and CLKOUT are optional. The only active pins are /CON, CCLK, and DO, as shown in FIG. 39.

Figure 40:
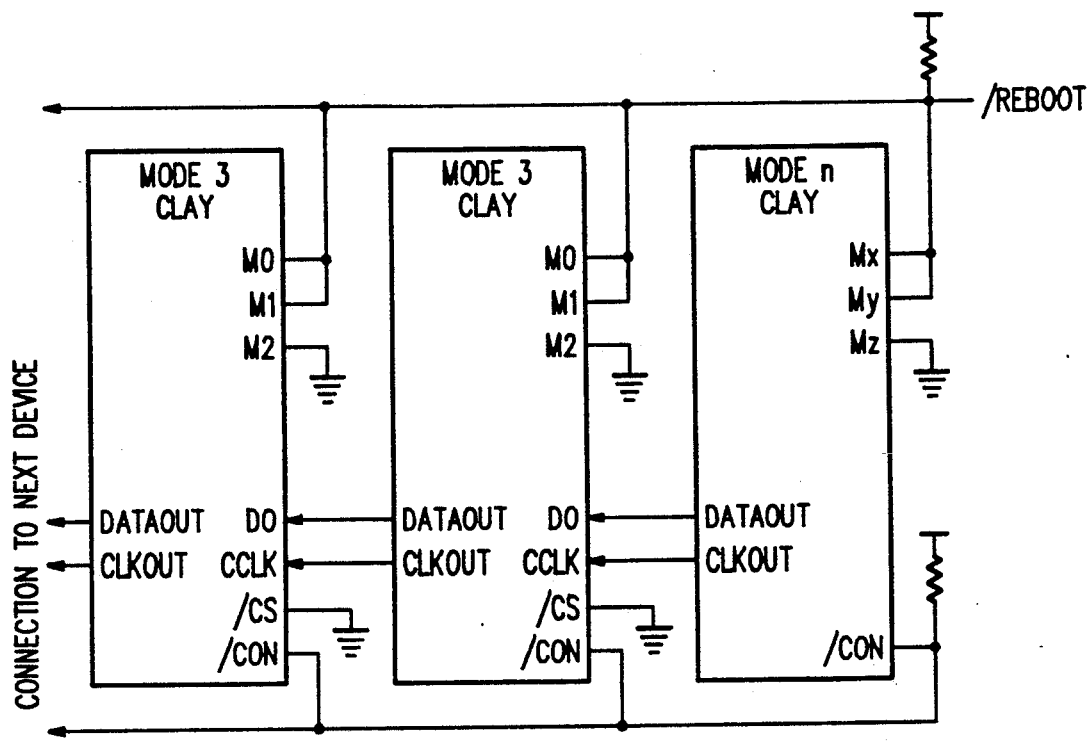
FIG. 40 is a schematic representation illustrating the cascaded configuration of multiple CLAs of the type shown in FIG. 18.

Mode 3 can be used for the cascaded configuration of multiple CLA devices 100, as shown in FIG. 40. The first device 100 in a chain can use any configuration mode. If the first device 100 receives a configuration file containing another preamble instead of a postamble, then the remaining configuration data will be ignored by the first device 100 and passed on through its DATAOUT and CLKOUT pins to the next device 100. The DATAOUT pin of an upstream device 100 goes to DO of the downstream device 100, and the upstream CLKOUT pin connects to the downstream CCLK. In Mode 3, the CLKOUT signal is derived directly from the CCLK Input. The /CON pins of each device 100 in the cascade can be tied together to create a single "configuration complete" signal.

Figure 41:
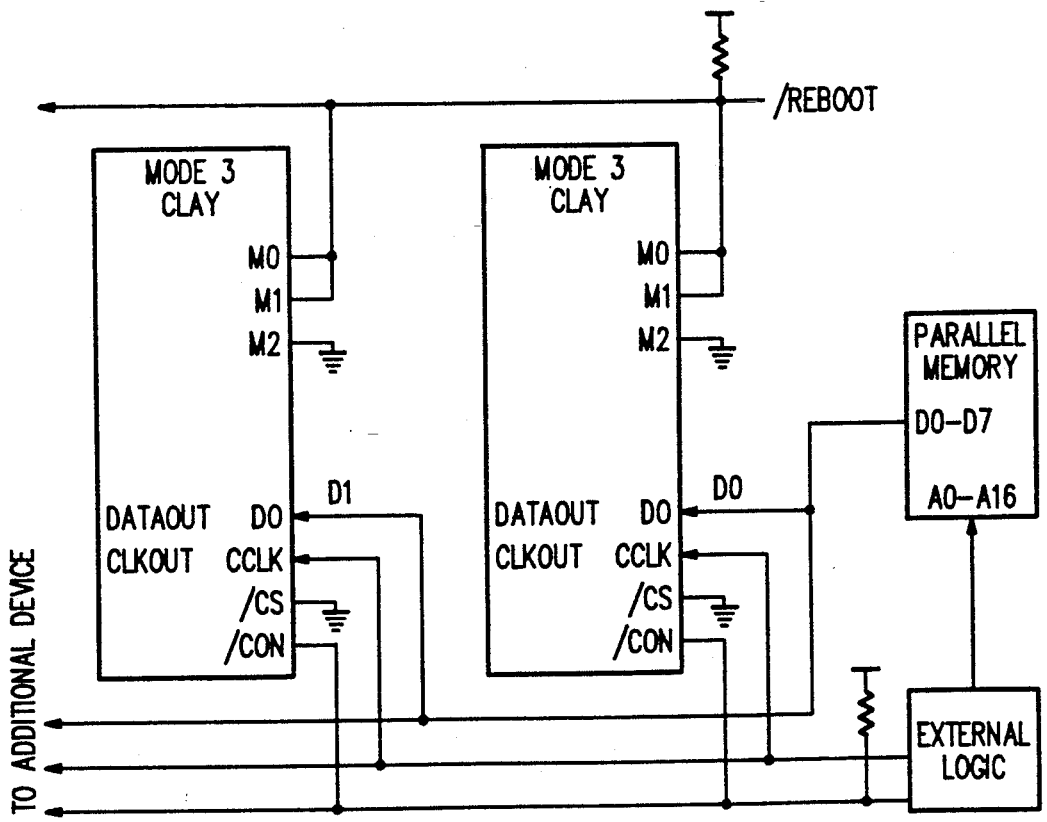
FIG. 41 is a schematic representation illustrating the parallel configuration of multiple CLAs of the type shown in FIG. 18.

It is also possible for an external processor to configure multiple Mode 3 CLA devices 100 in parallel by assigning a unique bit of its data path to the DO of each device 100, and tying the CCLK inputs of the devices 100 together as a write strobe, as shown in FIG. 41.

One advantage that the Mode 3 has over Mode 4 is that, depending on the accuracy of the user-supplied clock, the time required to configure the device 100 can be determined precisely. Also, because the user can supply a faster maximum clock rate than the typical internally-generated clock range, Mode 3 can be a faster configuration method. As long as data set-up and hold requirements are satisfied, the CCLK pulses can have arbitrary periods. Such a clock is required when using a synchronous communication ports or UARTs to configure the device 100 instead of a serial EPROM. It is necessary, however, to allow sufficient preceding and trailing clock pulses with respect to /CON going low CCLK is to be stopped entirely between configurations.

Figure 42:
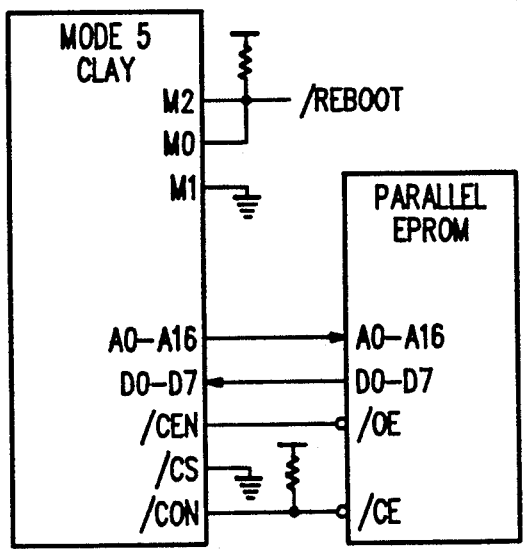
FIG. 42 is a schematic representation illustrating the address count-up, internal clock configuration mode of the FIG. 18 CLA array.

Count-up Address, Internal CCLK (Mode 5) mode requires the same number of parts as Mode 4, but uses more dual-function I/O pins during the configuration sequence. Because serial EPROMs are not currently available in sizes large enough of all multiple-device designs, the increased memory of a parallel EPROM is sometimes necessary. With the standard parallel EPROM, this configuration mode uses the CO-D7 data pins, the AO-A16 address pins, /CEN, and the fixed function pins, as shown in FIG. 42.

/CHECK, DATAOUT, and CLKOUT pins are optional in this mode.

Mode 5 supports auto-configuration. If the mode pins are set appropriately before the release of /CON during the power-up boot sequence. After a brief period, the CLA device reasserts /CON low, and the internal oscillator begins to toggle CCLK. This causes the CLA device 100 to generate addresses, beginning at 0X00000 to read the configuration file from the parallel EPROM. The external memory address is incremented and one byte of configuration data is loaded from the D0-D7 pins on each rising edge of CCLK until configuration is complete. The CLA device 100 will then release /CON, indicating that the device 100 is ready for use.

Thirteen address bits are required to fully program a single CLA device 100; the extra addresses allow multiple device configuration and reconfiguration, as well as the ability to share a larger memory space with other components of a system. If cascading is necessary, the parallel input data is automatically converted to a serial data output stream on the DATAOUT and CLKOUT pins. Configuration time will vary depending on the speed of the internal oscillator, but the maximum configuration time per array in this mode is about 10 milliseconds.

Figure 43:
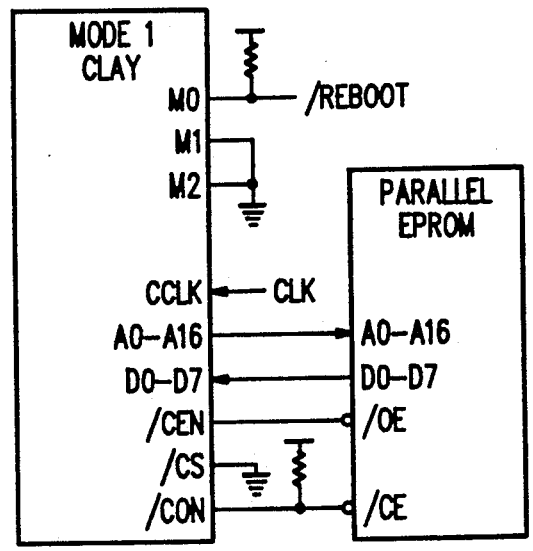
FIG. 43 is a schematic representation illustrating the address count-up, external clock configuration mode of the FIG. 18 CLA array.

The Count-up Address, External CCLK (Mode 1) mode is very much like Mode 5, above, with two exceptions: the user must supply as configuration clock to the CCLK pin and the user must always drive /CON low to start configuration. Mode 1 will not automatically generate a /CON signal after the power-up boot sequence. This configuration mode uses the D0-D7 data pins, the A0=A16 address pins /CEN and the fixed function pins, as shown in FIG. 43.

/CHECK, DATAOUT, and CLKOUT pins remain operational in this mode.

In Mode 2, the user can supply the maximum clock rate in order to complete configuration of a single device in under 1 millisecond. The use of cascading however, limits the parallel data rate to 800 KHz, since the internal clock is used to drive the CLKOUT pin. As in Mode 3, the CCLK signal can be synchronous or asynchronous.

The Count-Down Address, External CCLK (Mode 2) is identical to Mode 1, above, except that the DMA address counter starts at 1FFFF instead of 00000, and counts down instead of up. The two modes are included because a typical microprocessor uses the highest or lowest address to load its own reboot address vector. If the CLA device 100 is sharing a large EPROM with a microprocessor, it must start from the opposite end of the EPROM address map so that it does not interfere with the microprocessor, and vice versa.

Figure 44:
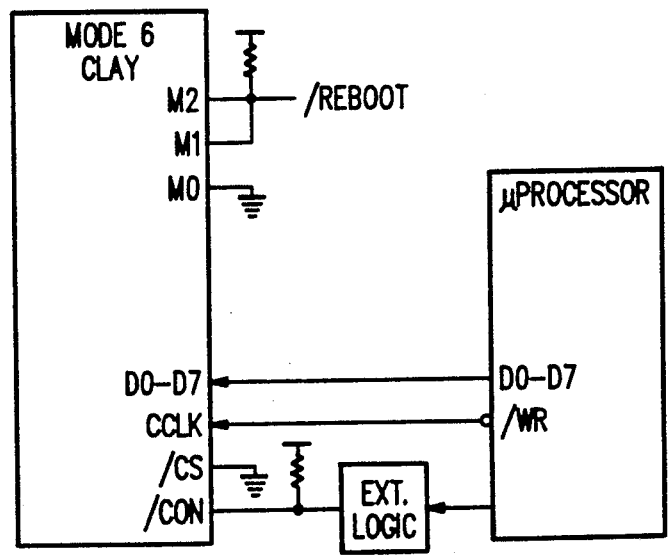
FIG. 44 is a schematic representation illustrating the byte-sequential, external clock configuration mode of the FIG. 18 CLA array.

The Byte-sequential, External CCLK (Mode 6) mode is similar to Mode 3, except that data is loaded in 8-bit words to decrease load time. This mode uses fewer dual-function pins than the does the Address mode because the CLA device 100 does not generate an address instead, the next byte in the data stream is assumed to be present on the rising edge of CCLK. During configuration, D0-D7 are the only dual-function pins required, as shown in FIG. 44. The pins /ERR, /CHECK, DATAOUT, and CLKOUT are optional. The CCLK requirements are the same as for Mode 1.

Figure 31:
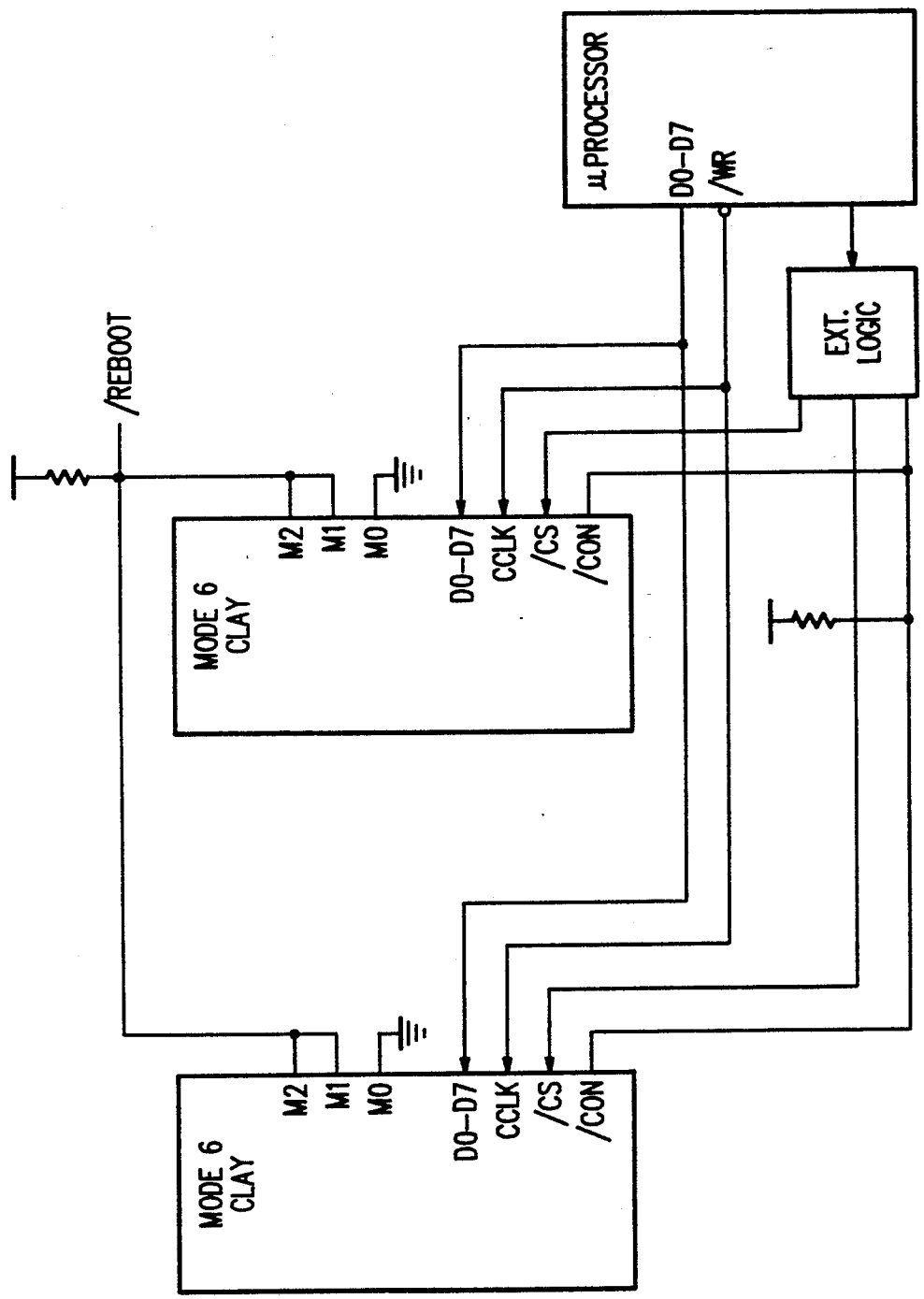
FIG. 31 is a schematic representation illustrating sequential configuration of multiple CLA arrays of the type shown in FIG. 18.

Intended to be used as the parallel port of a microprocessor, this mode may be best for a smart system in which the user intends to reconfigure the CLA device 100 as a regular part of system operation. Multiple CLA devices 100 can be configured by tying all the data busses together, as well as the /CON pins. The /CS pin can then be used to select individual devices for configuration. Alternatively, multiple CLA devices 100 can be configured in parallel by assigning each byte of a 32-bit processor's data path to a unique CLA device 100, and tying the CCLK inputs of the CLA devices 100 together as a common write strobe, as shown in FIG. 31. It is also possible to program the first device 100 in Mode 6, and cascade all downstream devices 100 in Mode 3 as outlined previously.

It should be understood that various alternatives to the embodiment of the invention described herein may be employed in practicing the invention. For example, although the inventive concepts are described above in the context of reconfigurable logic, these concepts are also applicable to one-time programmable logic. It is intended that the following claims define the scope of the invention and that methods and apparatus within the scope of these claims and their equivalents be covered thereby.

What is claimed is:

1. A configurable logic array comprising:
    a plurality of individually configurable logic cells arranged in a matrix that includes a plurality of rows of configurable logic cells and a plurality of columns of configurable logic cells;
    at least one row local bus running between adjacent rows of configurable logic cells, said configurable logic cells in said adjacent rows being selectively connectable thereto;
    at least one column local bus running between adjacent columns of configurable logic cells, said configurable logic cells in said adjacent columns being selectively connectable thereto;
    logic cell-to-local bus interface circuitry selectively connectable between a selected configurable logic cell and a selected row or column local bus to allow said selected configurable logic cell to either read data from or write data to said selected local bus, and simultaneously and selectively connectable between said selected configurable logic cell and one or more additional local busses; and
    direct interconnect means connectable between said selected configurable logic cell and at least one adjacent configurable logic cell such that an output signal provided by said selected configurable logic cell can be directly provided as an input signal to said at least one adjacent configurable logic cell independent of said local row and column busses.

2. A configurable logic array as in claim 1 and wherein the logic cell-to-local bus interface circuitry consists of 2+N pass elements, where N is the number of local busses connectable to the selected configurable logic cell.

3. A configurable logic array as in claim 1 and wherein the logic cell-to-local bus interface circuitry is responsive to a selected logic state of a configuration control signal such that the selected configurable logic cell is electrically disconnected from the selected local bus, the logic cell-to-local bus interface circuitry further including means responsive to the selected logic state of the configuration control signal for providing an input signal of a selected logic state to the selected configurable logic cell.

4. A logic interface circuit utilizable in a configurable logic array that includes a plurality of configurable logic cells, the logic interface circuit comprising:
    first and second pass elements, each pass element having first and second terminals and being configurable to be in either a conducting or anon-conducting state, the first terminal of the first pass element being connected to an output node of a selected configurable logic cell via a write interconnect bus, the first terminal of the second pass element being connected to an input node of the selected configurable logic cell via a read interconnect bus, and the second terminals of the first and second pass elements being connected together at a common node;
    configurable connection means for selectively connecting the common node to at least one local interconnect bus such that when the first pass element is configured to be in the conducting state, said configurable connection means is configurable to provide access by said at least one local interconnect bust to the input node of said selected configurable logic cell via the write interconnect bus, and such that when the second pass element is configured to be in the conducting state, said configurable connection means is configurable to provide access by said at least one local interconnect bus to the output node of said selected configurable logic cell via the read interconnect bus.

5. A logic interface circuit as in claim 4 and wherein the second pass element responds to first and second logic states of a read configuration control signal by being configured in the conducting and non-conducting states, respectively, the logic interface circuit further comprising logic state control means connected to the read interconnect bus and that responds to the second logic state of the read configuration control signal by providing an input signal of a predetermined logic state to the input node of said selected configurable logic cell via the read interconnect bus.

6. A logic interface circuit as in claim 5 and wherein the logic state control means comprises a P-channel transistor having its gate connected to receive the read configuration control signal, its drain connected to the read interconnect bus and its source connected to a supply voltage.

7. A logic interface circuit as in claim 4 and wherein the configurable connection means includes a first local bus pass element that responds to first and second logic states of a first local bus configuration signal by selectively connecting and disconnecting, respectively, the common node to the at least one local interconnect bus, and at least one additional local bus pass element that responds to first and second logic states of a second local bus configuration signal by selectively connecting and disconnecting, respectively, the common node to at least one additional local interconnect bus.

8. A logic interface circuit as in claim 4 and wherein the configurable connection means includes a first local bus pass element that responds to first and second logic states of a first local bus configuration signal by selectively connecting and disconnecting, respectively, the common node to the at least one local interconnect bust, and a plurality of additional local bus pass elements, each additional local bus pass element being individually responsive to first and second logic states of a corresponding local bus configuration signal by selectively connecting and disconnecting the common node to a corresponding additional local interconnect bus.

9. A logic interface circuit as in claim 4 and wherein the first pass element responds to first and second logic states of a write configuration control signal by being configured in the conducting and non-conducing states, respectively, and wherein the second pass element responds to first and second logic states of a read configuration control signal by being configured in the conducting and non-conducting state, respectively.

10. A logic interface circuit as in claim 9 and wherein the first pass element responds to the first logic state of the write configuration control signal and the second pass element responds to the first logic state of the read configuration control signal by providing a feedback data path between the output node and the input node of the selected configurable logic cell via the common node.

11. A logic interface circuit as in claim 10 and wherein the configurable connection means includes a first local bus pass element connected between the common node and the at least one local interconnect bus and that responds to first and second logic states of a first local bus pass element configuration control signal by being configured in the conducting and nonconducting state, respectively, such that the first local bus pass element responds to said first local bus pass element configuration control signal in the first logic state by providing a local bus data path between the common node and the at least one local interconnect bus.

12. A logic interface circuit as in claim 9 and wherein the first pass element provides a data path between the output node of the selected configurable logic cell and the common node in response to the first logic state of the write configuration control signal and, further, wherein the configurable connection means includes a first local bus pass element connected between the common node and the at least one local interconnect bus and responsive to first and second logic state of a first local bus pass element configuration control signal by being configured in the conducting and non-conducting states, respectively, such that the first local bus pass element responds to the first logic state of the first local bus pass element configuration control signal by providing a data path between the output node of the selected configurable logic cell and the at least one local interconnect bus via the common node.

13. A logic interface circuit as in claim 12 and wherein the second pass element responds to the second logic state of the read configuration control signal by being configured in the non-conducting state.

14. A logic interface circuit as in claim 13 and further comprising logic state control means connected to the read interconnect bus and responsive to the second logic state of the read configuration control signal by providing an input signal of a predetermined logic state to the input node of said selected configurable logic cell via the read interconnect bus.

15. A logic interface circuit as in claim 14 wherein the logic state control means comprises a P-channel transistor having its gate connected to receive the read configuration control signal, its drain connected to the read interconnect bus and its source connected to a supply voltage, such that the input signal to the input node of the selected configurable logic cell is a logic "1".

16. A logic interface circuit as in claim 9 and wherein the first pass element responds to the second logic state of the write configuration control signal by being in the non-conductive state and the second pass element provides a data path between the input node of the selected configurable logic cell and the common node in response to the first logic state of the read configuration control signal and, further, wherein the configurable connection means includes a first local bus pass element connected between the common node and the at least one local interconnect bus and responsive to first and second logic states of a first local bus pass element configuration control signal by being configured in the conducting and non-conducting states, respectively, such that the first local bus pass element responds to the first logic state of the first local bus pass element configuration control signal by providing a data path between the at least one local interconnect bus and the input node of the selected configurable logic cell via the common node.

17. A logic interface circuit as in claim 9 wherein the first pass element and the second pass element respond to the second logic level of the write configuration control signal and the read configuration control signal, respectively, by being in the non-conductive state and, further, wherein the configurable connection means includes a first local bus pass element connected between the common node and the at least one local interconnect bus and that responds to first and second logic states of a first local bus pass element configuration control signal by being configured in the conducting and non-conducting states, respectively, and wherein the configurable connection means further includes a second node and at least one additional local interconnect bus and responsive to first and second logic states of a second local bus pass element configuration control signal by being configured in the conducting and non-conducting states, respectively, such that when the first and second pass elements are configured in the non-conducting state and the fist and second local bus pass elements are configured in the conducting state, a bi-directional data path is provided between that at least one local interconnect bus and the at least one additional local interconnect bus via the common node.

* * * * *

UNITED STATES PATENT AND TRADEMARK OFFICE
CERTIFICATE OF CORRECTION

PATENT NO. : 5,298,805
DATED : March 29, 1994
INVENTOR(S) : Tim Garverick

It is certified that error appears in the above - identified patent and that said Letters Patent is hereby corrected as shown below:

On title page: Item [75]

Inventor: Tim Garverick, Cupertino

[NOTE: Tim Garverick is sole inventor; delete all other inventors -- please see attached]

In the claims:

In Col. 22, line 28, delete "anon-con--" and replace with --a non-con---.

In Col. 22, line 44, delete "bust" and replace with --bus--.

In Col. 23, line 17, delete "bust" and replace with --bus--.

In Col. 23, line 47, delete "state" and replace with --states--.

In Col. 23, line 60, delete "state" and replace with --states--.

In Col. 24, line 55, after "second" insert --local bus pass element connected between the common--.

In Col. 24, line 63, delete "that" and replace with --the--.

Signed and Sealed this

Twenty-sixth Day of July, 1994

*Attest:*

BRUCE LEHMAN

*Attesting Officer*     *Commissioner of Patents and Trademarks*